United States Patent
Asai

(10) Patent No.: US 9,145,606 B2
(45) Date of Patent: Sep. 29, 2015

(54) METHOD OF MANUFACTURING SEMICONDUCTOR DEVICE, CLEANING METHOD, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventor: Masayuki Asai, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 19 days.

(21) Appl. No.: 13/650,358

(22) Filed: Oct. 12, 2012

(65) Prior Publication Data

US 2013/0102161 A1    Apr. 25, 2013

(30) Foreign Application Priority Data

Oct. 20, 2011  (JP) .................................. 2011-230438
Aug. 22, 2012  (JP) .................................. 2012-183265

(51) Int. Cl.
   *H01L 21/44* (2006.01)
   *C23C 16/44* (2006.01)
   *H01L 21/02* (2006.01)

(52) U.S. Cl.
   CPC ...... *C23C 16/4405* (2013.01); *H01L 21/02334* (2013.01)

(58) Field of Classification Search
   USPC ................................................. 438/681, 905
   See application file for complete search history.

(56) References Cited

U.S. PATENT DOCUMENTS

| 2006/0124058 A1 | 6/2006 | Sakai et al. | |
| 2009/0004877 A1* | 1/2009 | Asai | 438/758 |
| 2009/0149032 A1* | 6/2009 | Kameda et al. | 438/778 |

FOREIGN PATENT DOCUMENTS

| JP | 2009033121 | 2/2009 |
| JP | 2010-206050 | 9/2010 |
| KR | 20060113763 A | 11/2006 |
| KR | 20100126253 A | 12/2010 |
| WO | 2004044970 A1 | 5/2004 |

OTHER PUBLICATIONS

Office Action in corresponding Korean Application No. 10-2012-0106852, dated Oct. 17, 2013, along with an English translation.

* cited by examiner

*Primary Examiner* — Asok K Sarkar
(74) *Attorney, Agent, or Firm* — Edell, Shapiro & Finnan LLC

(57) ABSTRACT

A method of manufacturing a semiconductor device includes forming a film on a substrate in a process chamber, and removing a deposit from at least a portion of an inside of the process chamber after forming the film, wherein removing the deposit includes performing a cycle a predetermined number of times, the cycle including a first process of supplying a first gas for etching the deposit into the process chamber and a second process of supplying a second gas into the process chamber so as to increase a pressure in the process chamber, the second gas being incapable of etching a member constituting the process chamber or having an etchability against the member lower than that of the first gas.

19 Claims, 15 Drawing Sheets

FIG. 6

| SETTING TIME (s) FOR THIRD PROCESS | TIME (s) OF ONE CYCLE | DER (Å / cycle) | DER (Å / cycle) | NF₃ GAS CONSUMPTION EFFICIENCY (%) |
|---|---|---|---|---|
| 0 | 26 | 19.8 | 45.7 | 23.2 |
| 5 | 31 | 45 | 87.1 | 52.6 |
| 7 | 33 | 55 | 100.0 | 64.3 |
| 10 | 36 | 70 | 116.7 | 81.9 |
| 13 | 39 | 83.4 | 128.3 | 97.5 |
| 15 | 41 | 84.5 | 123.7 | 98.8 |
| 30 | 56 | 85.5 | 91.6 | 100.0 |

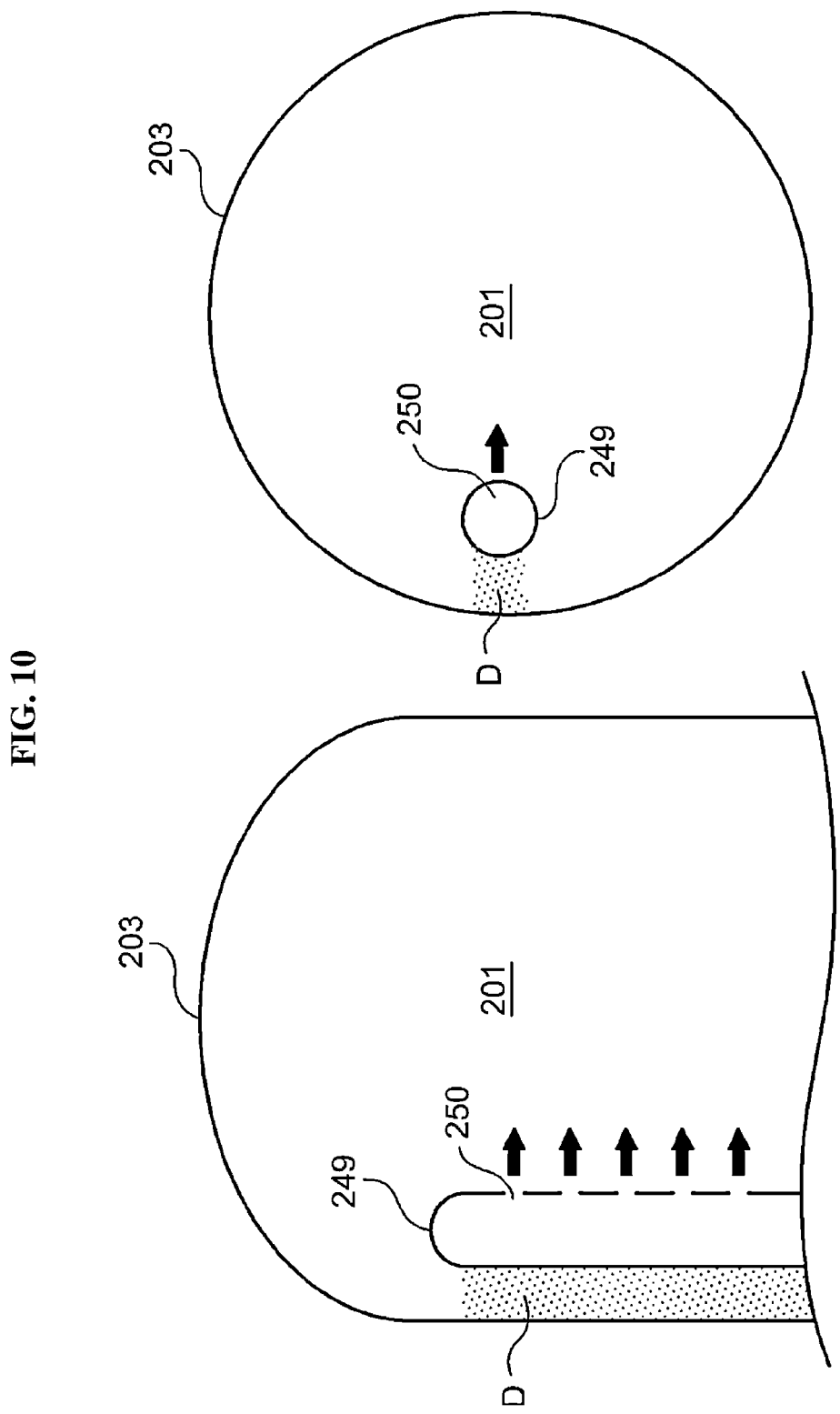

METHOD OF MANUFACTURING SEMICONDUCTOR DEVICE, CLEANING METHOD, SUBSTRATE PROCESSING APPARATUS AND NON-TRANSITORY COMPUTER-READABLE RECORDING MEDIUM

CROSS REFERENCE TO RELATED APPLICATIONS

This application claims foreign priority under 35 U.S.C. §119(a)-(d) to Application Nos. JP 2011-230438 and JP 2012-183265, filed on Oct. 20, 2011 and Aug. 22, 2012, respectively, the entire contents of each of which are hereby incorporated by reference.

FIELD OF THE INVENTION

The present invention relates to a method of manufacturing a semiconductor device that performs film formation treatment on a substrate, a cleaning method, a substrate processing apparatus and a non-transitory computer-readable recording medium.

BACKGROUND

One example of a process for manufacturing a semiconductor includes a film formation process of depositing a predetermined thin film on a substrate using a chemical vapor deposition (CVD) method or an atomic layer deposition (ALD) method. The CVD method refers to a method in which a thin film having elements included in a source molecule thereof is deposited on a substrate to be treated using reaction of a vapor phase of a gaseous source and a surface of the substrate. Among CVD methods, controlling the deposition of a thin film at an atomic layer level is referred to as an ALD method, and the ALD method is characterized in that a temperature of the substrate is low. Also, plasma is used to remove impurities from the thin film deposited using the CVD method or aid in performing a chemical reaction of a film forming source adsorbed using the ALD method.

For example, formation of an amorphous silicon nitride film (hereinafter referred to as a "SiN film") using the ALD method is performed using dichlorosilane (DCS) and ammonia ($NH_3$) plasma. A process of forming a SiN film on a substrate includes, for example, DCS irradiation treatment and $NH_3$ plasma irradiation treatment. Both of these treatments are repeatedly performed (hereinafter referred to as "cycle treatment") to deposit a SiN film having a predetermined film thickness on a substrate.

In such an ALD or CVD method, however, a thin film is cumulatively deposited on a contact portion in addition to the substrate. Foreign substance contamination in which microcracks are generated due to the cumulative deposition and the substrate is contaminated by foreign substances formed by peeling of the microcracks is problematic. The foreign substance contamination readily takes place as a deposition rate and a thickness of a cumulative film increase.

To prevent the foreign substance contamination as described above, a cleaning process for removing a cumulative film by performing cleaning treatment after a series of film formation treatments is also executed. Such treatment includes introducing a cleaning gas such as nitrogen trifluoride ($NF_3$) or fluorine ($F_2$) into a reaction chamber, reacting the cleaning gas with a SiN film, converting the SiN film into gases and exhausting the gases (for example, see Japanese Patent Laid-open Publication No.: 2009-33121).

SUMMARY

However, in the conventional cleaning treatment, a film residue may be formed at a region (for example, a dead space D shown in FIG. 10) in which flow of a gas slows down in a process chamber 201 between a reaction tube 203 and a nozzle 249 through which a cleaning gas is supplied, as shown in FIG. 10. Then, the film residue (foreign substances) may be gradually deposited and thus particles may occur as film formation treatment and cleaning treatment continue to be performed.

The present invention is directed to provide a method of manufacturing a semiconductor device capable of inhibiting contamination of an inside of a reaction tube by foreign substances, a cleaning method, a substrate processing apparatus and a non-transitory computer-readable recording medium.

According to one embodiment of the present invention, there is provided a method of manufacturing a semiconductor device, including:

(a) forming a film on a substrate in a process chamber; and (b) removing a deposit from at least a portion of an inside of the process chamber after forming the film, wherein the step (b) includes performing a cycle a predetermined number of times, the cycle including a first process of supplying a first gas for etching the deposit into the process chamber and a second process of supplying a second gas into the process chamber so as to increase a pressure in the process chamber, the second gas being incapable of etching a member constituting the process chamber or having an etchability against the member lower than that of the first gas.

According to another embodiment of the present invention, there is provided a cleaning method of removing a deposit from at least a portion of an inside of a process chamber after forming a film on a substrate in the process chamber, including:

performing a cycle a predetermined number of times, the cycle including a first process of supplying a first gas for etching the deposit into the process chamber and a second process of supplying a second gas into the process chamber so as to increase a pressure in the process chamber, the second gas being incapable of etching a member constituting the process chamber or having an etchability against the member lower than that of the first gas.

According to still another embodiment of the present invention, there is provided a substrate processing apparatus including:

a process chamber configured to process a substrate;

an exhaust system configured to exhaust the process chamber;

a source gas supply system configured to supply into the process chamber a source gas contributing to a film formation;

a first gas supply system configured to supply a first gas capable of removing from an inside of the process chamber a deposit formed by supplying the source gas into the process chamber;

a second gas supply system configured to supply a second gas incapable of etching a member constituting the process chamber or having an etchability against the member lower than that of the first gas; and a control unit configured to control the exhaust system, the source gas supply system, the first gas supply system and the second gas supply system so as to perform a cycle a predetermined number of times, the cycle including supplying the first gas into the process chamber by the first gas supply system after supplying the source gas into the process chamber by the source gas supply system to form a film on the substrate and subsequently supplying the second gas into the process chamber by the second gas supply system so as to increase a pressure in the process chamber.

According to yet another embodiment of the present invention, there is provided a non-transitory computer-readable recording medium storing a program causing a computer to perform a process, the process including:

(a) forming a film on a substrate in a process chamber; and (b) removing a deposit from at least a portion of an inside of the process chamber after forming the film, wherein the step (b) includes performing a cycle a predetermined number of times, the cycle including a first process of supplying a first gas for etching the deposit into the process chamber and a second process of supplying a second gas into the process chamber so as to increase a pressure in the process chamber, the second gas being incapable of etching a member constituting the process chamber or having an etchability against the member lower than that of the first gas.

According to the present invention, there can be provided a method of manufacturing a semiconductor device capable of inhibiting contamination of an inside of a reaction tube by foreign substances, a cleaning method, a substrate processing apparatus and a non-transitory computer-readable recording medium.

BRIEF DESCRIPTION OF THE DRAWINGS

FIG. 6 is an experimental result showing a relationship between a setting time of a third process and a reduction amount of a SiN film per cycle in the cleaning process which may be preferably used in one embodiment of the present invention.

FIG. 10 is a diagram showing a region in which a dead space is formed in the reaction tube.

DETAILED DESCRIPTION

First Embodiment of the Present Invention

Hereinafter, a preferred first embodiment of the present invention will be described with reference to the accompanying drawings.

Figure 1:
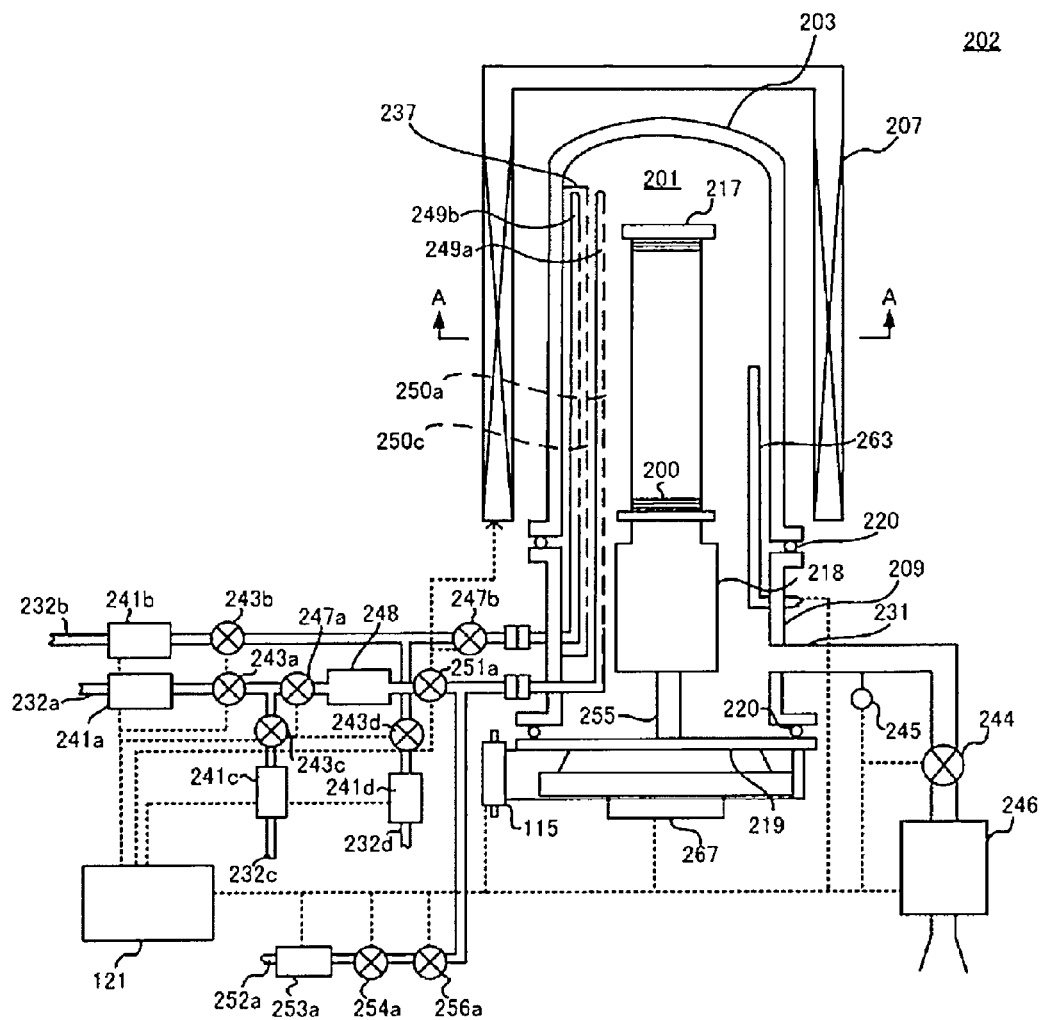
FIG. 1 is a schematic configuration diagram of one example of a processing furnace which may be preferably used in one embodiment of the present invention and members accompanying the processing furnace, particularly showing a vertical cross-sectional view of a portion of the processing furnace.
Figure 2:
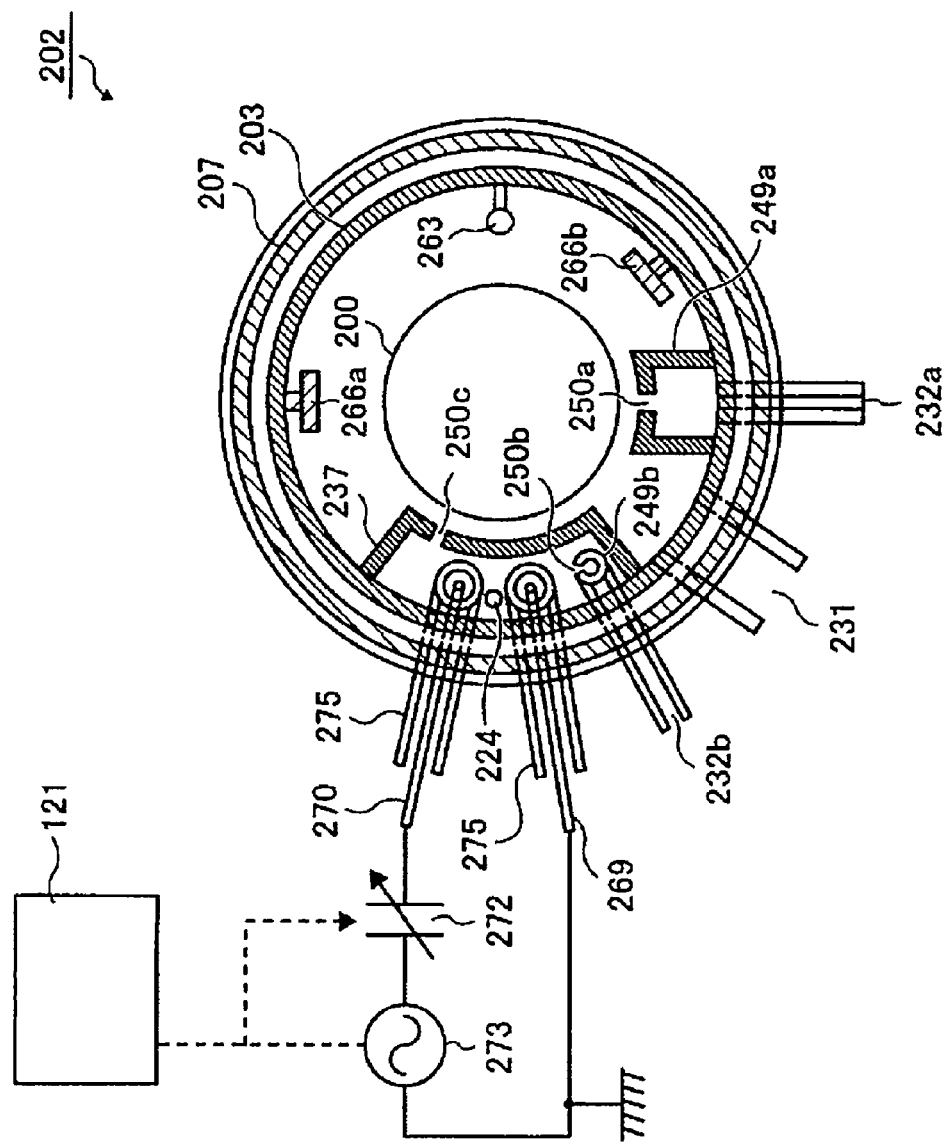
FIG. 2 is a cross-sectional view taken along line A-A in the processing furnace shown in FIG. 1 which may be preferably used in one embodiment of the present invention.

FIG. 1 is a schematic configuration diagram of a vertical processing furnace of a substrate processing apparatus which is preferably used in a preferred embodiment of the present invention, showing a vertical cross section of a portion of the processing furnace 202. FIG. 2 is a schematic configuration diagram of the vertical processing furnace of the substrate processing apparatus which is preferably used in a preferred embodiment of the present invention, showing a transverse section of the processing furnace 202.

As shown in FIG. 1, the processing furnace 202 includes a heater 207 serving as a heating unit (a heating mechanism). The heater 207 has a cylindrical shape. The heater 207 is vertically fixed while supported by a heater base (not shown) serving as a retaining plate. A reaction tube 203 constituting a reaction container (processing container) to be concentric with the heater 207 is installed inside the heater 207.

A manifold 209 is installed at a lower portion of the reaction tube 203. Ring-shaped flanges are installed at a lower end of the reaction tube 203 and an upper opening end of the manifold 209, respectively. An 0-ring 220 serving as a hermetic member is disposed between the flanges, and a space between the flanges is hermetically sealed.

As a furnace port lid capable of hermetically closing a lower end opening of the reaction tube 203, a seal cap 219 is installed below the manifold 209. The seal cap 219 is configured to come in contact with a lower end of the manifold 209 in a vertical direction from a lower portion thereof. For example, the seal cap 219 is made of a metal such as stainless steel, and formed in a disk shape. The O-ring 220 serving as a seal member in contact with the lower end of the manifold 209 is installed on a surface of the seal cap 219. A process chamber 201 is formed at least by the reaction tube 203, the manifold 209 and the seal cap 219. Also, the manifold 209 and reaction tube 203 are made of the same material, and formed integrally with other. A rotary mechanism 267 configured to rotate a boat 217 as will be described below is installed at a side of the seal cap 219 which is opposite to the process chamber 201. A rotating shaft 255 of the rotary mechanism 267 is connected to the boat 217 through the seal cap 219. The rotary mechanism 267 is configured to rotate the wafer 200 by rotating the boat 217. The seal cap 219 is configured to be vertically raised or lowered by a boat elevator 115 serving as an elevation mechanism installed outside the reaction tube 203. The boat 217 can be loaded to and unloaded from the process chamber 201 by means of the boat elevator 115.

As a substrate retaining unit (referred to as a support or a substrate retainer), the boat 217 is vertically installed at the seal cap 219 via a quartz cap 218 serving as a heat isolating member. For example, the quartz cap 218 is a retainer that is made of a heat-resistant material such as quartz or silicon carbide to function as a heat isolating unit and retain a boat. For example, the boat 217 is made of a heat-resistant material such as quartz or silicon carbide, and configured to support a plurality of wafers 200 in multiple stages in a direction of a pipe axis in a state in which the wafers 200 are concentrically arranged in a horizontal posture. Also, the quartz cap 218 is not installed separately from the boat 217, but may be integrally installed at a lower portion of the boat 217. Also, a heat insulating plate which is formed at a lower portion of the boat 217 or a lower portion of the quartz cap 218 in a form of a circular plate may be configured to be installed in plural numbers instead of the quartz cap 218 or in addition to the quartz cap 218.

A first nozzle 249a and a second nozzle 249b are installed at the manifold 209 to pass through the manifold 209. A first gas supply pipe 232a is connected to the first nozzle 249a, and a second gas supply pipe 232b is connected to the second nozzle 249b.

A mass flow controller (MFC) 241a serving as a flow rate control device (a flow rate control unit), valves 243a and 247a serving as opening/closing valves, a gas gathering unit 248 and a valve 251a serving as an opening/closing valve are installed at the first gas supply pipe 232a sequentially from an upstream side thereof. For example, the gas gathering unit 248 is configured as a gas tank or a spiral pipe which has a higher gas capacity than a conventional pipe.

Then, as the valve 247a or the valve 251a is opened/closed, DCS gas serving as a first processing gas to be described below may be gathered in the gas gathering unit 248 via the first gas supply pipe 232a, or the gathered DCS gas may be supplied into the process chamber 201. Also, an inert gas supply pipe 232c is connected to the first gas supply pipe 232a. A mass flow controller 241c that is a flow rate control device serving as a flow rate control unit and a valve 243c serving as an opening/closing valve are installed at the inert gas supply pipe 232c sequentially from an upstream side thereof. Also, the above-described first nozzle 249a is connected to a leading end of the first gas supply pipe 232a. The first nozzle 249a is installed in an arc-shaped space between an inner wall of the reaction tube 203 and the wafer 200 so that the first nozzle 249a is directed upwards from a lower portion to an upper portion of an inner wall of the reaction tube 203 in a stacking direction of the wafers 200. The first nozzle 249a is configured as an L-shaped long nozzle. Gas supply holes 250a configured to supply a gas are installed at a lateral surface of the first nozzle 249a. The gas supply holes 250a open toward the center of the reaction tube 203.

The gas supply holes 250a are installed in plural numbers in a space spanning from the lower portion to the upper portion of the reaction tube 203, and the gas supply holes 250a each have the same opening area, and are also installed at the same opening pitch. A first gas supply system includes mainly the first gas supply pipe 232a, the mass flow controller 241a, the valves 243a and 247a, the gas gathering unit 248, the valve 251a and the first nozzle 249a. Also, a first inert gas supply system generally includes the inert gas supply pipe 232c, the mass flow controller 241c and the valve 243c.

Also, a cleaning gas supply pipe 252a is connected to the first gas supply pipe 232a at a downstream side of the valve 251a. A mass flow controller 253a serving as a flow rate control device (a flow rate control unit), a valve 254a serving as an opening/closing valve and a valve 256a serving as an opening/closing valve are installed at the cleaning gas supply pipe 252a sequentially from an upstream side thereof. A cleaning gas supply system generally includes the cleaning gas supply pipe 252a, the mass flow controller 253a and the valves 254a and 256a.

A mass flow controller (MFC) 241b serving as a flow rate control device (a flow rate control unit) and valves 243b and 247b serving as an opening/closing valve are installed at the second gas supply pipe 232b sequentially from an upstream side thereof. Also, an inert gas supply pipe 232d is connected to the second gas supply pipe 232b at a downstream side of the valve 243b. A mass flow controller 241d serving as a flow rate control device (a flow rate control unit) and a valve 243d serving as an opening/closing valve are installed at the inert gas supply pipe 232d sequentially from an upstream side thereof. Also, the above-described second nozzle 249b is connected to a leading end of the second gas supply pipe 232b. The second nozzle 249b is installed inside a buffer chamber 237 serving as a gas dispersing space.

The buffer chamber 237 is installed as an arc-shaped space between the inner wall of the reaction tube 203 and the wafer 200 so that the buffer chamber 237 is arranged in a region spanning from a lower portion to an upper portion of the inner wall of the reaction tube 203 in a stacking direction of the wafers 200. Gas supply holes 250c configured to supply a gas are installed at an end portion of a wall of the buffer chamber 237 that is adjacent to the wafer 200. The gas supply holes 250c opening toward the center of the reaction tube 203 are particularly desirable when performing the supply of a gas having high directivity. Preferably, the gas supply holes 250c are installed in plural numbers in a space spanning from the lower portion to the upper portion of the reaction tube 203, and the gas supply holes 250c each have the same opening area, and are also formed at the same opening pitch.

The second nozzle 249b is installed on an end portion that is opposite to an end portion of the buffer chamber 237 in which the gas supply holes 250c are installed so as to rise from the lower portion to the upper portion of the inner wall of the reaction tube 203 in a stacking direction of the wafers 200. The second nozzle 249b is configured as an L-shaped long nozzle. Gas supply holes 250b configured to supply a gas are installed at a lateral surface of the second nozzle 249b. The gas supply holes 250b may open toward the center of the buffer chamber 237. Like the gas supply holes 250c of the buffer chamber 237, the gas supply holes 250b may be installed in plural numbers in a space spanning from the lower portion to the upper portion of the reaction tube 203. When a difference in pressure in the buffer chamber 237 and the process chamber 201 is small, the plurality of gas supply holes 250b may be formed at the same opening area and the same opening pitch in the space spanning from an upstream side (lower portion) to a downstream side (upper portion) thereof. However, when the difference in pressure is large, the gas supply holes 248b may have increasing opening areas or a decreasing opening pitch in the space spanning from the upstream side to the downstream side thereof.

In this embodiment, when the opening areas or the opening pitch of the gas supply holes 250b is adjusted from the upstream side to the downstream side thereof as described above, a gas is ejected through each of the gas supply holes 250b at an amount at which the gas has a different flow velocity but substantially the same flow rate. Then, the gas ejected through each of the gas supply holes 250b is first introduced into the buffer chamber 237, and the flow velocity of the gas in the buffer chamber 237 is equalized.

That is, the gas ejected into the buffer chamber 237 through each of the gas supply holes 250b of the second nozzle 249b is ejected into the process chamber 201 through the gas supply holes 250c of the buffer chamber 237 after a particle velocity of the gas in the buffer chamber 237 is slowed down. As described above, the gas ejected into the buffer chamber 237 through each of the gas supply holes 250b is ejected into the process chamber 201 through each of the gas supply holes 250c at a uniform flow rate and flow velocity.

A second gas supply system generally includes the second gas supply pipe 232b, the mass flow controller 241b, the valves 243b and 247b, the second nozzle 249b, and the buffer chamber 237. Also, a second inert gas supply system generally includes the inert gas supply pipe 232d, the mass flow controller 241d, and the valve 243d.

For example, a silicon source gas, that is, a gas containing silicon (Si) (a silicon-containing gas), is supplied as a first processing gas into the process chamber 201 through the first gas supply pipe 232a via the mass flow controller 241a, the valves 243a and 247a, the gas gathering unit 248, the valve 251a and the first nozzle 249a. For example, dichlorosilane ($SiH_2Cl_2$, DCS) gas or hexachlorodisilane ($Si_2Cl_6$, HCD) gas may be used as the silicon-containing gas. Also, the first processing gas may be in a solid, liquid or gaseous state at normal temperature and pressure, but the first processing gas in a gaseous state may be described herein. A vaporizer (not shown) is provided when the first processing gas is in a liquid state at normal temperature and pressure.

As a second processing gas configured to modify a source gas, for example, a gas containing nitrogen (N) (a nitrogen-containing gas) is supplied into the process chamber 201 through the second gas supply pipe 232b via the mass flow controller 241b, the valves 243b and 247b, the second nozzle 249b, and the buffer chamber 237. For example, ammonia ($NH_3$) gas may be used as the nitrogen-containing gas.

As the inert gas, for example, a gas containing nitrogen ($N_2$) is supplied into the process chamber 201 through the inert gas supply pipes 232c and 232d via the mass flow controller 241c, the valve 243c, the first gas supply pipe 232a and the first nozzle 249a, and the mass flow controller 241d, the valve 243d, the second gas supply pipe 232b, the second nozzle 249b and the buffer chamber 237, respectively.

As the cleaning gas, for example, nitrogen trifluoride ($NF_3$) gas is supplied into the process chamber 201 through the cleaning gas supply pipe 252a via the mass flow controller 253a, the valves 254a and 256a and the first nozzle 249a.

For example, when a gas is allowed to flow through each of the gas supply pipes as described above, a source gas supply system, that is, a silicon-containing gas supply system (a silane-based gas supply system), is also configured by the first gas supply system. Also, a modifying gas supply system, that is, a nitrogen-containing gas supply system, is configured by the second gas supply system.

A first rod-shaped electrode 269 that is a first electrode and a second rod-shaped electrode 270 that is a second electrode, both of which have a slender and long structure, are arranged from a lower portion to an upper portion of the reaction pipe 203 in a stacking direction of the wafers 200 in the buffer chamber 237, as shown in FIGS. 1 and 2. The first rod-shaped electrode 269 and the second rod-shaped electrode 270 are installed to be parallel with the second nozzle 249b, and covered and protected with an electrode protection pipe 275 that is a protection pipe configured to protect each of the electrodes spanning from an upper portion to a lower portion of the electrode protection pipe 275. One of the first rod-shaped electrode 269 and the second rod-shaped electrode 270 is connected to a high-frequency power source 273 via a matching transformer 272, and the other electrode is connected to an earth that is a reference electric potential. As a result, plasma is generated at a plasma-generating region 224 between the first rod-shaped electrode 269 and the second rod-shaped electrode 270. Generally, a plasma source serving as a plasma generator (a plasma generating unit) includes the first rod-shaped electrode 269, the second rod-shaped electrode 270, the electrode protection pipe 275, the matching transformer 272, and the high-frequency power source 273. Also, the plasma source functions as an activation mechanism configured to activate a gas with plasma, as will be described below.

The electrode protection pipe 275 has a structure in which each of the first rod-shaped electrode 269 and the second rod-shaped electrode 270 may be inserted into the buffer chamber 237 in a state in which each of the first rod-shaped electrode 269 and the second rod-shaped electrode 270 is isolated from an atmosphere of the buffer chamber 237. Here, when an inside of the electrode protection pipe 275 has the same atmosphere as an external environment (an atmosphere), each of the first rod-shaped electrode 269 and the second rod-shaped electrode 270 inserted into the electrode protection pipe 275 is oxidized with heat generated from the heater 207. Therefore, an inert gas purge mechanism (not shown) configured to charge and purge the electrode protection pipe 275 with an inert gas such as nitrogen and significantly reduce an oxygen concentration to prevent oxidation of the first rod-shaped electrode 269 or the second rod-shaped electrode 270 is installed at the inside of the electrode protection pipe 275.

An exhaust pipe 231 configured to exhaust an atmosphere in the process chamber 201 is installed at the manifold 209. Also, the exhaust pipe 231 may be configured to be installed at the reaction tube 203 instead of the manifold 209. A vacuum pump 246 serving as a vacuum exhaust device is connected to the exhaust pipe 231 via a pressure sensor 245 serving as a pressure detector (a pressure detecting unit) configured to detect a pressure in the process chamber 201 and an automatic pressure controller (APC) valve 244 serving as a pressure regulator (a pressure regulating unit). Therefore, the inside of the process chamber 201 is configured to be vacuum-exhausted so that a pressure in the process chamber 201 reaches a predetermined pressure (a degree of vacuum). Also, the APC valve 244 is an opening/closing valve which is configured to be capable of performing start and stop of the vacuum exhaust in the process chamber 201 through opening/closing of the valve and also configured to regulate a pressure by adjusting an opening degree of the valve. Generally, an exhaust system includes mainly the exhaust pipe 231, the APC valve 244, the vacuum pump 246, and the pressure sensor 245.

A temperature sensor 263 serving as a temperature detector is installed inside the reaction tube 203, and configured so that a temperature in the process chamber 201 has a desired temperature distribution by adjusting a state of electricity communication into the heater 207 based on temperature information detected by the temperature sensor 263. The temperature sensor 263 is formed in an L shape like the nozzles 249a and 249b, and installed along the inner wall of the reaction tube 203.

Plate-shaped members 266a and 266b made of quartz and configured to determine whether a film attached to an inside of the reaction tube 203 is removed after the supply of a cleaning gas to be described below are installed in the reaction tube 203. The plate-shaped members 266a and 266b are installed so that the plate-shaped members 266a and 266b extend upwards from a lower portion to an upper portion of an inner wall of the reaction tube 203 in a stacking direction of the wafers 200. For example, the plate-shaped member 266a is disposed at an inner wall surface of the reaction tube 203 at a position facing the gas supply holes 250a of the first nozzle 249a, and the plate-shaped member 266b is disposed at the inner wall surface of the reaction tube 203 at a position adjacent to the first nozzle 249a.

A controller 121 serving as a control unit (a control means) is connected to the mass flow controllers 241a, 241b, 241c, 241d and 253a, the valves 243a, 243b, 243c, 243d, 247a, 247b, 251a, 254a and 256a, the pressure sensor 245, the APC valve 244, the vacuum pump 246, the heater 207, the temperature sensor 263, the boat rotary mechanism 267, the boat elevator 115, and the high-frequency power source 273. The controller 121 is configured to control an operation of adjusting flow rates of various gases by means of the mass flow controllers 241a, 241b, 241c, 241d and 253a, an opening/closing operation of the valves 243a, 243b, 243c, 243d, 247a, 247b, 251a, 254a and 256a, an opening/closing operation of the APC valve 244 and a pressure regulating operation based on the pressure sensor 245, a temperature adjusting operation of the heater 207 based on the temperature sensor 263, a start/stop operation of the vacuum pump 246, an operation of adjusting a rotational speed of the boat rotary mechanism 267 and an operation of raising/lowering the boat elevator 115, or to control power supply of the high-frequency power source 273.

Figure 11:
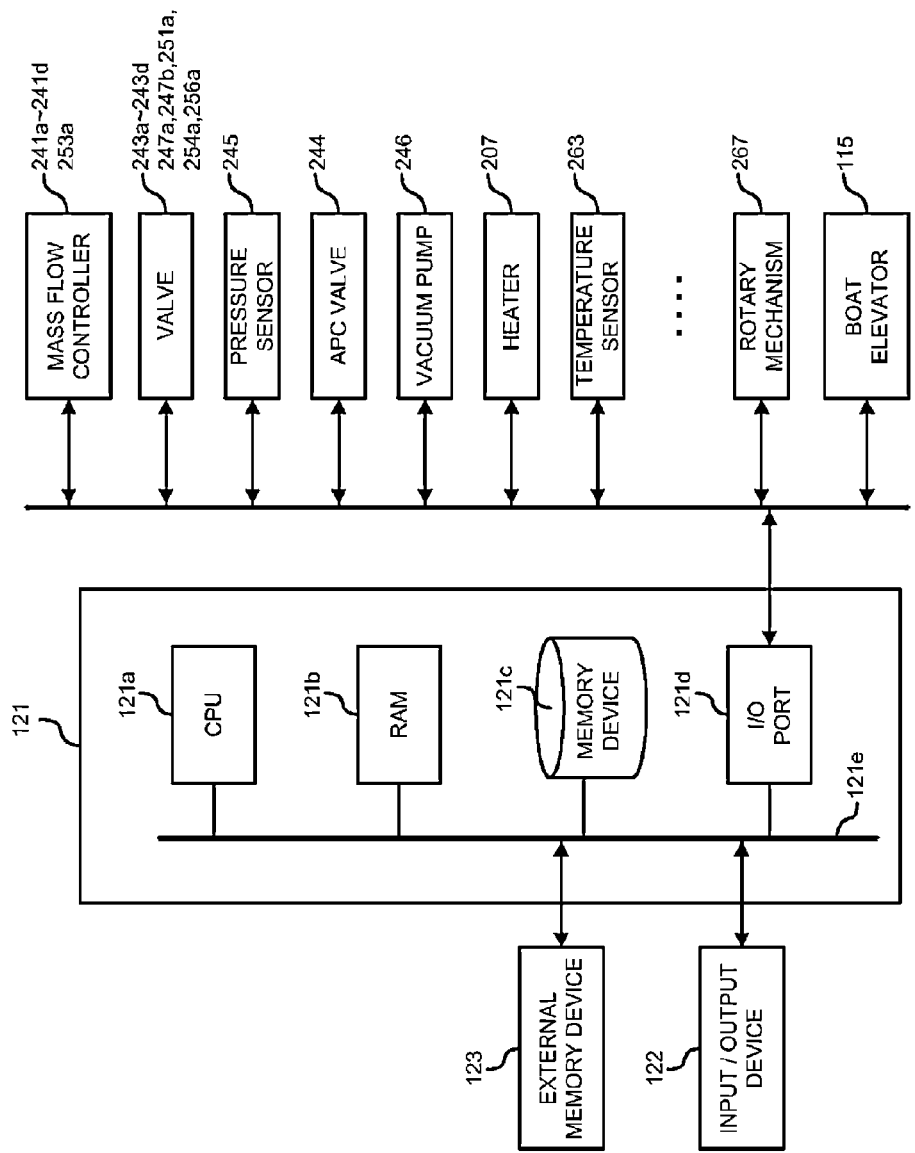
FIG. 11 is a schematic configuration diagram of a controller of a substrate processing apparatus which may be preferably used in one embodiment of the present invention.

As shown in FIG. 11, the controller 121 serving as a control unit (a control means) is also configured as a computer which includes a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus 121e. For example, an input/output device 122 formed as a touch panel is connected to the controller 121.

For example, the memory device 121c includes a flash memory, a hard disk drive (HDD) and the like. A control program configured to control operation of the substrate processing apparatus or a process recipe describing the sequence and conditions for processing a substrate as will be described below are stored in the memory device 121c so that the control program and the process recipe can be read from the memory device 121c. Also, the process recipe is combined so that predetermined results are obtained by executing the respective sequences at the controller 121 in a substrate processing process to be described below, and thus functions as a program. Hereinafter, both of the process recipe and the control program are simply referred to as a program. Also, when the term "program" is used in this specification, there are cases in which the program includes only a single process recipe, includes only a single control program, or includes both of the process recipe and the control program. Also, the RAM 121b is configured as a memory area (a work area) to temporarily store a program or data read by the CPU 121a.

The I/O port 121d is connected to the mass flow controllers 241a, 241b, 241c, 241d, 241e, 241f and 241g, the valves 243a, 243b, 243c, 243d, 243e, 243f and 243g, the pressure sensor 245, the APC valve 244, the vacuum pump 246, the heater 207, the temperature sensor 263, the rotary mechanism 267, and the boat elevator 115, as described above.

The CPU 121a is configured to read the process recipe by means of the memory device 121c according to input of operation commands by means of the input/output device 122 while reading and executing the control program by means of the memory device 121c. Then, to comply with the read contents of the process recipe, the CPU 121a is configured to control an operation of adjusting flow rates of various gases by means of the mass flow controllers 241a, 241b, 241c, 241d and 253a, an opening/closing operation of the valves 243a, 243b, 243c, 243d, 247a, 247b, 251a, 254a and 256a, an opening/closing operation of the APC valve 244 and a pressure regulating operation by means of the valve 244 based on the pressure sensor 245, a temperature adjusting operation of the heater 207 based on the temperature sensor 263, a start/stop operation of the vacuum pump 246, an operation of rotating the boat 217 and adjusting a rotational speed of the boat 217 by means of the rotary mechanism 267, and an operation of raising/lowering the boat 217 by means of the boat elevator 115.

Also, the present invention is not limited to a case in which the controller 121 is configured as a dedicated computer. The controller 121 may be configured as a general-purpose computer. For example, the controller 121 according to this embodiment may be configured by preparing an external memory device 123 in which the above-described program is stored (for example, a magnetic disk such as a magnetic tape, a flexible disk or a hard disk, an optical disc such as CD or DVD, a magneto-optical disc such as MO, and a semiconductor memory such as a USB memory or a memory card), and installing a program on a general-purpose computer using such an external memory device 123. In addition, a method of supplying a program to a computer is not limited to a case in which the program is supplied to the computer via the external memory device 123. For example, the program may be supplied using a communication means such as the Internet or a dedicated line without using the external memory device 123. Also, the memory device 121c or the external memory device 123 is configured as a computer-readable recording medium. Hereinafter, these devices are simply referred to as a recording medium. Also, when the term "recording medium" is used in this specification, there are cases in which the recording medium includes only a single memory device 121c, includes only a single external memory device 123, or includes both of the memory device 121c and the external memory device 123.

Next, as one process of the method of manufacturing a semiconductor device using the processing furnace of the substrate processing apparatus as described above, a sequence example of a process of forming an insulating film on a substrate and performing self-cleaning treatment on the insulating film will be described. In the following description, operations of parts constituting the substrate processing apparatus are controlled by the controller 121.

In this specification, DCS gas serving as a silicon-containing gas and $NH_3$ gas serving as a nitrogen-containing gas are used as the first processing gas and the second processing gas, respectively. One example in which a SiN film serving as an insulating film is formed on a substrate and a device is self-cleaned will be described with reference to FIGS. 3 to 5.

Figure 3:
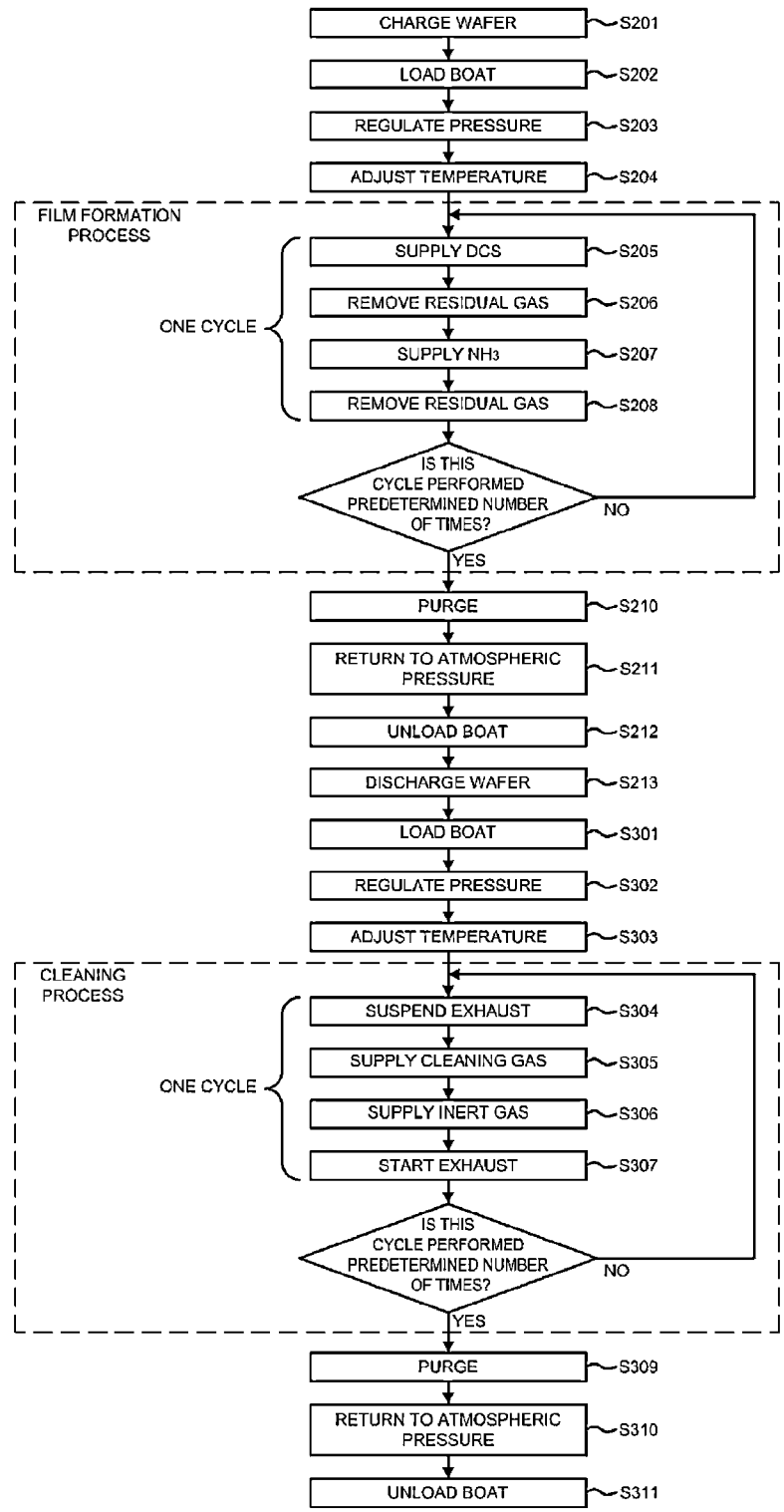
FIG. 3 is a diagram showing a flowchart explaining a film formation process and a cleaning process, both of which may be preferably used in one embodiment of the present invention.
Figure 4:
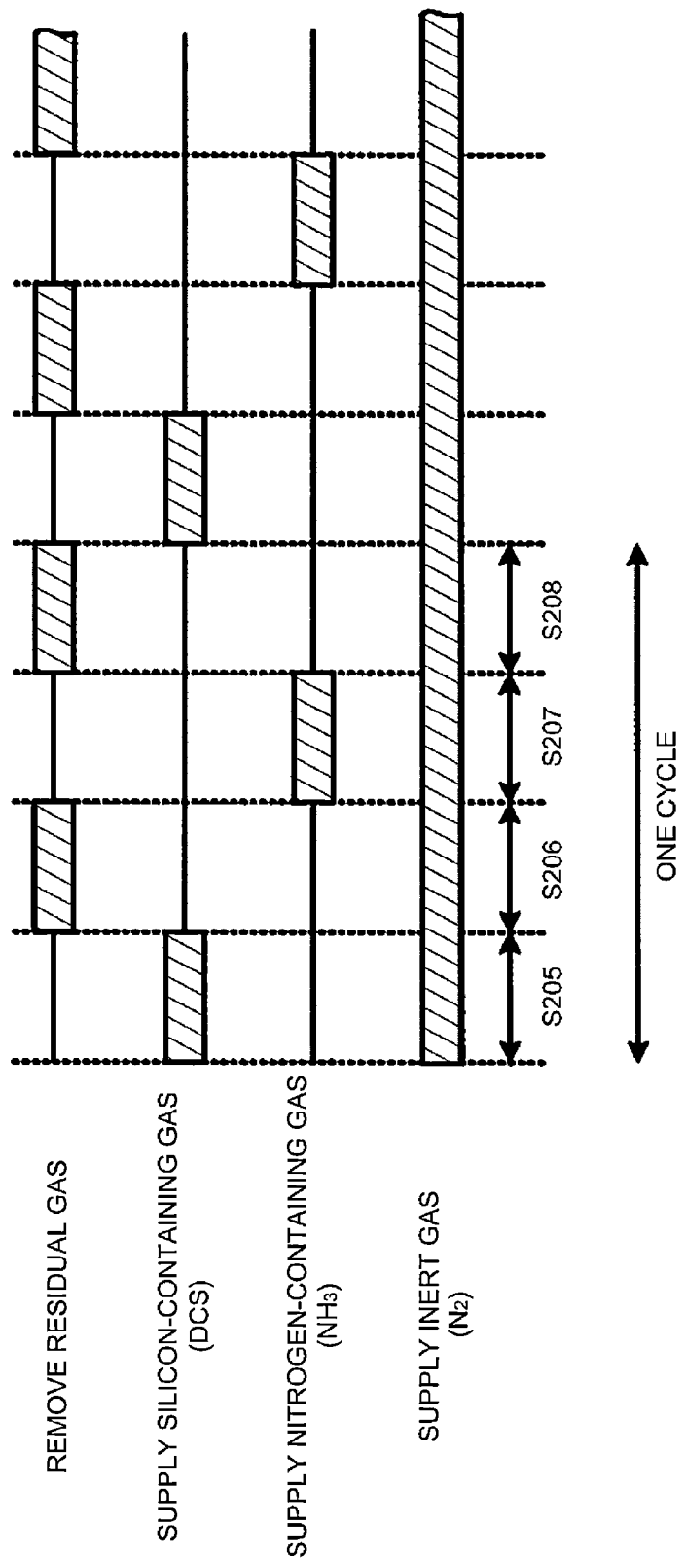
FIG. 4 is a diagram showing a sequence in the film formation process which may be preferably used in one embodiment of the present invention.
Figure 5:
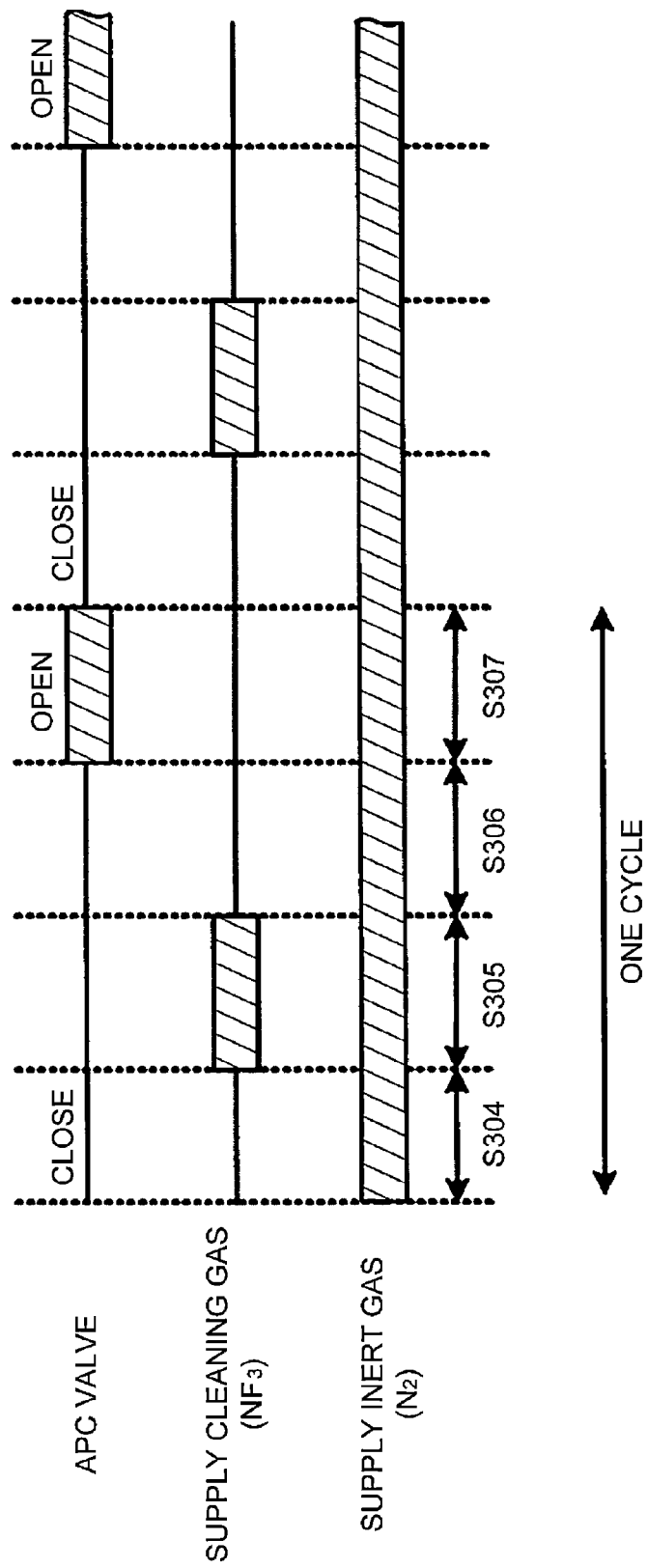
FIG. 5 is a diagram showing a sequence in the cleaning process which may be preferably used in one embodiment of the present invention.

FIG. 3 is a flowchart explaining a film formation process and a cleaning process, both of which may be preferably used in one embodiment of the present invention. Also, FIG. 4 is a sequence diagram in the film formation process which may be preferably used in one embodiment of the present invention, and FIG. 5 is a sequence diagram in the cleaning process which may be preferably used in one embodiment of the present invention.

First, the plurality of wafers 200 are charged into the boat 217 (wafer charging, Step 201). Next, the boat 217 supporting the plurality of wafers 200 is raised by means of the boat elevator 115 to be loaded into the process chamber 201 (boat loading, Step 202), as shown in FIG. 1. In this state, the seal cap 219 is configured to seal a lower end of the manifold 209 via the O-ring 220.

An inside of the process chamber 201 is vacuum-exhausted by means of the vacuum pump 246 so that the inside of the process chamber 201 reaches a desired pressure (degree of vacuum). In this case, the pressure in the process chamber 201 is measured by the pressure sensor 245, and the APC valve 244 is feedback-controlled based on the measured pressure (pressure regulation, Step 203). Also, the inside of the process chamber 201 is heated by the heater 207 so that the inside of the process chamber 201 reaches a desired temperature. In this case, a state of electricity communication into the heater 207 is feedback-controlled based on temperature information detected by the temperature sensor 263 so that the inside of the process chamber 201 has a desired temperature distribution (temperature adjustment, Step 204). Next, the wafers 200 are rotated by rotating the boat 217 by means of the rotary mechanism 267. Subsequently, a film formation process of forming a SiN film is performed by supplying DCS gas and $NH_3$ gas into the process chamber 201. Also, the DCS gas is a gas that may be used alone to perform film formation, and a Si film is formed on the substrate in the process chamber 201 due to the pyrolysis.

Film Formation Process

Step 205

In Step 205, first, DCS gas is allowed to flow. The valves 243a and 247a or the valve 251a of the first gas supply pipe 232a are opened and closed. Therefore, the DCS gas is allowed to flow through the first gas supply pipe 232a via the gas gathering unit 248. A flow rate of the DCS gas flowing through the first gas supply pipe 232a is adjusted by means of the mass flow controller 241a. The DCS gas whose flow rate is adjusted is supplied into the process chamber 201 through the gas supply holes 250a of the first nozzle 249a, and simultaneously exhausted through the gas exhaust pipe 231. In this case, the valve 243c is preferably opened to allow an inert gas to flow through the inert gas supply pipe 232c all at once. A Group 18 element gas such as He gas, Ne gas, or Ar gas may be used as the inert gas. In this embodiment in which a temperature of the heater 207, that is, a temperature of the wafer 200, is set within a low temperature range, $N_2$ gas may be used here. A flow rate of the $N_2$ gas flowing through the inert gas supply pipe 232c is adjusted by means of the mass flow controller 241c. The $N_2$ gas whose flow rate is adjusted is supplied into the process chamber 201 along with the DCS gas, and simultaneously exhausted through the gas exhaust pipe 231. In this case, the valve 243d and the valve 247b may be preferably opened to allow an inert gas to flow through the inert gas supply pipe 232d all at once. A Group 18 element gas such as He gas, Ne gas, or Ar gas may be used as the inert gas. In this embodiment in which a temperature of the heater 207, that is, a temperature of the wafer 200, is set within a low temperature range, $N_2$ gas may be used here. A flow rate of the $N_2$ gas flowing through the inert gas supply pipe 232d is adjusted by means of the mass flow controller 241d. The $N_2$ gas whose flow rate is adjusted is supplied into the buffer chamber 237 through the gas supply holes 250b of the second nozzle 249b. Thereafter, the $N_2$ gas supplied into the buffer chamber 237 is supplied into the process chamber 201 through the gas supply holes 250c, and simultaneously exhausted through the gas exhaust pipe 231. Therefore, the DCS gas is allowed to flow through the buffer chamber 237 and the second nozzle 249b so that deposition of the DCS gas in the buffer chamber 237 and the second nozzle 249b can be inhibited.

In this case, an opening degree of the APC valve 244 is properly adjusted so that a pressure in the process chamber 201 reaches a pressure of, for example, 10 to 1,000 Pa. For example, a supply flow rate of the DCS gas controlled by the mass flow controller 241a is set to a flow rate of 100 to 5,000 sccm. For example, a time required to expose the wafer 200 to the DCS gas, that is, a gas supply time (irradiation time), is set to a time range of 2 to 120 seconds. In this case, a temperature of the heater 207 is, for example, set so that a temperature of the wafer 200 reaches a temperature of 300 to 650° C.

A silicon layer (a Si layer) serving as the silicon-containing layer is formed on an underlying film formed on a surface of the wafer 200 by supplying the DCS gas. The silicon-containing layer may be a chemical adsorption (surface adsorption) layer of DCS.

Step 206

In Step 206, after the silicon-containing layer is formed, the valve 243a is closed to suspend the supply of the DCS gas. In this case, the APC valve 244 of the gas exhaust pipe 231 is kept open to vacuum-exhaust an inside of the process chamber 201 using the vacuum pump 246 so that an unreacted gas remaining in the process chamber 201 or the DCS gas after contributing to formation of the silicon-containing layer is eliminated from the process chamber 201. In this case, the valves 243c, 247a and 251a may also be kept open to maintain the supply of the $N_2$ gas into the process chamber 201. Also, the valves 243c, 247a and 251a, the valve 243d, and the valve 247b may be kept open to maintain the supply of the $N_2$ gas into the process chamber 201. Therefore, an effect of eliminating an unreacted gas remaining in the process chamber 201 or the DCS gas after contributing to formation of the silicon-containing layer from the process chamber 201 is improved. In addition to the $N_2$ gas, a rare gas such as Ar gas, He gas, Ne gas, or Xe gas may be used as the inert gas.

Step 207

In Step 207, after the residual gas in the process chamber 201 is removed, the valves 243b and 247b of the second gas supply pipe 232b are opened to allow $NH_3$ gas serving as a nitrogen-containing gas to flow through the second gas supply pipe 232b. The $NH_3$ gas is a gas that may not be used alone to perform film formation. A flow rate of the $NH_3$ gas flowing through the second gas supply pipe 232b is adjusted by means of the mass flow controller 241b. The $NH_3$ gas whose flow rate is adjusted is supplied into the buffer chamber 237 through the gas supply holes 250b of the second nozzle 249b. In this case, high-frequency electric power is applied between the first rod-shaped electrode 269 and the second rod-shaped electrode 270 from the high-frequency power source 273 via the matching transformer 272. Therefore, the $NH_3$ gas supplied into the buffer chamber 237 is excited with plasma, supplied as an active species into the process chamber 201 through the gas supply holes 250c, and simultaneously exhausted through the gas exhaust pipe 231. In this case, the valve 243d is preferably opened to allow $N_2$ gas serving as the inert gas to flow through the inert gas supply pipe 232d all at once. The $N_2$ gas is supplied into the process chamber 201 along with the $NH_3$ gas, and simultaneously exhausted through the gas exhaust pipe 231. In this case, the valve 243c, the valve 247a and the valve 251a may also be opened to allow the inert gas to flow through the inert gas supply pipe 232c all at once. A Group 18 element gas such as He gas, Ne gas, or Ar gas may be used as the inert gas. In this embodiment in which a temperature of the heater 207, that is, a temperature of the wafer 200, is set within a low temperature range, the $N_2$ gas may be preferably used here. A flow rate of the $N_2$ gas flowing through the inert gas supply pipe 232c is adjusted by means of the mass flow controller 241c. The $N_2$ gas whose flow rate is adjusted is supplied into the process chamber 201 through the gas supply holes 250a of the first nozzle 249a, and simultaneously exhausted through the gas exhaust pipe 231. As a result, the flow of the $NH_3$ gas through the first nozzle 249a may be inhibited.

When the $NH_3$ gas is excited with plasma to flow as an active species, an opening degree of the APC valve 244 is properly adjusted so that a pressure in the process chamber 201 reaches a pressure of, for example, 10 to 100 Pa. For example, a supply flow rate of the $NH_3$ gas controlled by the mass flow controller 241b is set to a flow rate of 1,000 to 10,000 sccm. For example, a time required to expose the wafer 200 to the active species obtained by exciting the $NH_3$ gas with plasma, that is, a gas supply time (irradiation time), is set to a time range of 2 to 120 seconds. In this case, a temperature of the heater 207 is set so that a temperature of the wafer 200 reaches a temperature of 300 to 650° C., as described above in Step 205. Also, the high-frequency electric power applied between the first rod-shaped electrode 269 and the second rod-shaped electrode 270 by means of the high-frequency power source 273 is, for example, set to have an electric power of 50 to 1,000 W. Since the $NH_3$ gas has a high reaction temperature, the $NH_3$ gas does not easily react at the above-described wafer temperature and pressure in the process chamber. Therefore, the $NH_3$ is excited with plasma to be converted into an active species, and allowed to flow. For this reason, a temperature of the wafer 200 may be maintained at a low temperature set as described above. Also, when the $NH_3$ gas is supplied, the $NH_3$ gas is not excited with plasma, but may be thermally activated under non-plasma conditions by properly adjusting a temperature of the heater 207 so that a temperature of the wafer 200 reaches a temperature of, for example, 650° C. or more, and also properly adjusting an opening degree of the APC valve 244 so that a pressure in the process chamber 201 reaches a pressure of, for example, 50 to 3,000 Pa. Also, when the $NH_3$ gas is activated with heat and supplied, a soft reaction may also take place.

In this case, the gas flowing through the process chamber 201 is an active species obtained by exciting the $NH_3$ gas with plasma, or $NH_3$ gas thermally activated by increasing a temperature in the process chamber 201, and the DCS gas does not flow through the process chamber 201. Therefore, the $NH_3$ gas does not cause a vapor phase reaction, and the $NH_3$ gas that becomes an active species or is activated reacts with a portion of the silicon-containing layer serving as a first layer formed on the wafer 200 in Step 205. As a result, the silicon-containing layer is nitrided so that the silicon-containing layer is modified into a second layer containing silicon and nitrogen, that is, a silicon nitride layer (a SiN layer).

Step 208

In Step 208, the valve 243b of the second gas supply pipe 232b is closed to suspend the supply of the $NH_3$ gas. In this case, the APC valve 244 of the gas exhaust pipe 231 is kept open to vacuum-exhaust an inside of the process chamber 201 using the vacuum pump 246, and eliminate an unreacted gas remaining in the process chamber 201 or the $NH_3$ gas contributing to nitridation from the process chamber 201. In this case, the valves 243d and 247b may also be kept open to maintain the supply of the $N_2$ gas into the process chamber 201. Also, the valves 243d, 247b, 243c, 247a and 251a may be preferably kept open to maintain the supply of the $N_2$ gas into the process chamber 201. Therefore, an effect of eliminating an unreacted gas remaining in the process chamber 201 or the $NH_3$ gas after contributing to nitridation from the process chamber 201 is improved.

As the nitrogen-containing gas, a gas obtained by exciting $N_2$ gas, $N_3$ gas, and $N_3H_8$ gas with plasma or heat may be used in addition to the gas obtained by exciting the $NH_3$ gas with plasma or heat. Also, a gas obtained by exciting a gas obtained by diluting the above-described gases with a rare gas such as Ar gas, He gas, Ne gas, or Xe gas with plasma or heat may be used here.

A SiN film containing silicon and nitrogen and having a predetermined film thickness may be formed on the wafer 200 by performing one cycle, which includes Steps 205 to S208 as described above, at least once (Step 209). Also, the above-described cycle may be repeatedly performed a number of times.

When a film formation treatment of forming a SiN film having a predetermined film thickness is performed, the inert gas such as $N_2$ gas is supplied into the process chamber 201 and then exhausted so that an inside of the process chamber 201 is purged with the inert gas (gas purging, Step 210). Thereafter, an atmosphere in the process chamber 201 is replaced with the inert gas (inert gas replacement) so that a pressure in the process chamber 201 returns to normal pressure (returning to atmospheric pressure, Step 211).

Next, the seal cap 219 is lowered by means of the boat elevator 115, a lower end of the manifold 209 is opened, and the processed wafer 200 is then unloaded from the lower end of the manifold 209 out of the reaction tube 203 in a state in which the processed wafer 200 is supported by the boat 217 (boat unloading, Step 212). Thereafter, the processed wafer 200 is discharged from the boat 217 (wafer discharging, Step 213).

As described above, the SiN film may be formed on a surface of the wafer 200 using the DCS gas and the $NH_3$ gas.

Also, even when hexachlorodisilane ($Si_2Cl_6$, HCD) and $NH_3$ are used as the source gas used to form a SiN film and when a Si source or a nitridation source is also used, as well as when the DCS gas and $NH_3$ gas are used, an etching method according to a preferred embodiment of the present invention may be preferably applicable. Also, even when the Si source and the nitridation source are alternately supplied to form a SiN film using an ALD method, and also when the Si source and the nitridation source are supplied at the same time to form a SiN film using a CVD method, the etching method according to a preferred embodiment of the present invention may be preferably applicable.

Next, a cleaning process of the processing furnace 202 according to a preferred embodiment of the present invention will be described.

In a film formation process, a deposit is attached to the reaction tube 203, the manifold 209, an inner wall of the exhaust pipe 231, the buffer chamber 237, and inner or external walls of the first nozzle 249a and the second nozzle 249b. Components and an amount of the deposit vary according to a material of a film to be formed on the wafer 200, a film thickness and the kind of gases used. In addition to a case in which a cleaning process is performed right after one cycle of the film formation process, there is a case in which the film formation process is performed a number of times to deposit a predetermined deposition amount of a deposit, followed by performing a cleaning process, or a case in which a cleaning process is performed before one cycle of the film formation process. Here, a case in which the cleaning process is performed right after one cycle of the film formation process will be described. In the cleaning process according to a preferred embodiment of the present invention, the gas cleaning is performed at a temperature in a standby state for film formation or in a temperature range around the temperature. That is, when a SiN film is formed in an ALD method using DCS gas and $NH_3$ gas as described above, a temperature of the heater 207 and a temperature of the wafer 200 are set to temperatures of 300 to 650° C. As a result, the gas cleaning is also performed when a temperature in the process chamber 201 is set to a temperature of 300 to 650° C. Also, gas cleaning starts at a temperature in a standby state for film formation or in a temperature range around the temperature so as to shorten a process time without a temperature change time. However, the temperature may be changed to a desired temperature and the gas cleaning may be performed under modified etching conditions.

In this embodiment, $NF_3$ gas is used as an etching gas (referred to as a cleaning gas) to etch a deposit attached to an inner wall of the reaction tube 203. The $NF_3$ gas may be supplied through the second gas supply pipe 232b that is an $NH_3$ gas port. However, since the $NH_3$ gas port is installed at an area having a relatively stronger plasma intensity than a Si source port configured to supply a source gas that may singly form a film, the $NH_3$ gas may be supplied through the first gas supply pipe 232a that is a Si source side, as shown in FIG. 1. Therefore, the members constituting the process chamber 201 (for example, quartz members such as the reaction tube 203, the nozzles 249a and 249b, and the buffer chamber 237) and the exhaust pipe 231 may be inhibited from being damaged. Also, when problems such as inhibition of damage of the members constituting the process chamber 201 or the exhaust pipe 231, an increase in cost, and demand for an installation space are caused, the cleaning gas may be supplied through both of the first gas supply pipe 232a and the second gas supply pipe 232b.

During the gas cleaning, the cleaning gas is excited by transfer (delivery) of excitation energy from a $N_2$ species, which is supplied through the $NH_3$ gas port and excited, to the cleaning gas, or the cleaning gas diffusing around the $NH_3$ gas port or $N_2$ is excited with high frequencies. In this case, the gas cleaning is considered to be performed.

First, the empty boat 217 in which the wafer 200 is not loaded is raised by means of the boat elevator 115, and loaded into the process chamber 201 (boat loading, Step 301). In this state, the seal cap 219 seals a lower end of the manifold 209 via the O-ring 220.

An inside of the process chamber 201 is vacuum-exhausted by means of the vacuum pump 246 so that the inside of the process chamber 201 reaches a desired pressure (degree of vacuum). In this case, a pressure in the process chamber 201 is measured in the pressure sensor 245, and the APC valve 244 is feedback-controlled based on the measured pressure (pressure regulation, Step 302).

Meanwhile, the heater 207 is, for example, controlled to maintain an inside of the process chamber 201 at a temperature in a standby state for film formation ranging from 300 to 650° C., for example, a temperature of 630° C. (temperature adjustment, Step 303).

Next, a cleaning process of performing self-cleaning treatment is performed by supplying the $NF_3$ gas serving as the cleaning gas and $N_2$ gas serving as the inert gas into the process chamber 201.

Cleaning Process

Step 304, First Process (for Example, 1 Second)

First, the APC valve 244 is closed to suspend exhaust treatment of the inside of the process chamber 201.

Step 305, Second Process (for Example, 15 Seconds)

In Step 305, a predetermined amount (for example, 500 cc) of the $NF_3$ gas is allowed to flow into the process chamber 201 in which the exhaust treatment is suspended. That is, the $NF_3$ gas is allowed to flow through the cleaning gas supply pipe 252a by opening/closing the valves 254a and 256a of the cleaning gas supply pipe 252a. A flow rate of the $NF_3$ gas flowing through the cleaning gas supply pipe 252a is adjusted by means of the mass flow controller 253a. The $NF_3$ gas whose flow rate is adjusted is supplied into the process chamber 201 through the gas supply holes 250a of the first nozzle 249a. In this case, 75 cc of the $N_2$ gas serving as the inert gas may be preferably supplied into the process chamber 201 through the inert gas supply pipe 232c. Also, a temperature in the process chamber 201 is maintained at 630° C. during the above-described operations.

In the second process, the cleaning gas ($NF_3$ gas) is uniformly spread broadly regardless of the structures of the reaction tube 203 and the buffer chamber 237 which are the members constituting the process chamber 201 since the exhaust treatment is suspended in the above-described first process. This is because an isotropic increase in pressure in the process chamber 201 takes place since the gas has a nature in which a pressure flows from a high pressure zone to a low pressure zone.

In this case, when a deposit is not attached or is slightly attached to an inside or outside of the second nozzle 249b arranged in the buffer chamber 237, the valve 243d and the valve 247b may also be opened at the same time to allow the inert gas to flow through the inert gas supply pipe 232d. A Group 18 element gas such as He gas, Ne gas, or Ar gas may be used as the inert gas. In this embodiment in which a temperature of the heater 207, that is, a temperature of the wafer 200, is set within a low temperature range, the $N_2$ gas may be preferably used here. A flow rate of the $N_2$ gas flowing through the inert gas supply pipe 232d is adjusted by means of the mass flow controller 241d. The $N_2$ gas whose flow rate is adjusted is supplied into the buffer chamber 237 through the gas supply holes 250b of the second nozzle 249b. Thereafter, the $N_2$ gas supplied into the buffer chamber 237 is supplied into the process chamber 201 through the gas supply holes 250c, and simultaneously exhausted through the gas exhaust pipe 231. Therefore, the cleaning gas is allowed to flow through the buffer chamber 237 and the second nozzle 249b so that excessive deterioration of the buffer chamber 237 and second nozzle 249b can be inhibited.

Step 306, Third Process (X Seconds)

In Step 306, the valves 254a and 256a are closed to suspend the supply of the $NF_3$ gas, and a predetermined amount (for example, 1 slm) of the $N_2$ gas serving as the inert gas is allowed to flow by opening/closing the valve 243c and the valves 247a and 251a of the inert gas supply pipe 232c. That is, the inert gas that does not etch the reaction tube 203, buffer chamber 237, first nozzle 249a, and second nozzle 249b, all of which are members constituting the process chamber 201, rather than the $NF_3$ gas serving as the cleaning gas, is supplied into the process chamber 201 so as to increase a pressure in the process chamber 201.

As a result, degradation of the $NF_3$ gas can be facilitated by increasing a pressure in the process chamber 201, and the $NF_3$ gas can be removed by reaction with a deposit or a cumulative film. Also, consumption efficiency of the $NF_3$ gas may be improved.

In the third process, the $NF_3$ gas remaining in the first nozzle 249a is also pushed out by the $N_2$ gas by supplying the $N_2$ gas through the first nozzle 249a. As a result, an equivalent amount of the $NF_3$ gas may be supplied from an upstream side (lower portion) of the first nozzle 249a through each of the gas supply holes 250a that are arranged at a downstream side (upper portion) of the first nozzle 249a, and a time-dependent change in an opening area of each of the gas supply holes 250a may be made uniform. That is, when there is no third process, a larger amount of the $NF_3$ gas is allowed to flow through the gas supply holes 250a of an upstream side of the first nozzle 249a, and thus an opening area of the gas supply holes 250a of the upstream side should be further increased. As a result, a larger amount of the source gas is supplied to the wafers 200 arranged at the upstream side than the downstream side of the first nozzle 249a in a subsequent film formation process. Therefore, the uniformity in film thickness between the wafers 200 may be debased due to a difference in film thickness between the downstream side and the upstream side. However, these problems may be solved by performing the third process.

In this case, when a deposit is not attached or is slightly attached to the inside or outside of the second nozzle 249b arranged in the buffer chamber 237, the valve 243d and the valve 247b may be opened at the same time to allow the inert gas to flow through the inert gas supply pipe 232d. A Group 18 element gas such as He gas, Ne gas, or Ar gas may be used as the inert gas. In this embodiment in which a temperature of the heater 207, that is, a temperature of the wafer 200, is set within a low temperature range, $N_2$ gas may be preferably used here. A flow rate of the $N_2$ gas flowing through the inert gas supply pipe 232d is adjusted by means of the mass flow controller 241d. The $N_2$ gas whose flow rate is adjusted is supplied into the buffer chamber 237 through the gas supply holes 250b of the second nozzle 249b. Thereafter, the $N_2$ gas supplied into the buffer chamber 237 is supplied into the process chamber 201 through the gas supply holes 250c, and simultaneously exhausted though the gas exhaust pipe 231. Thus, the cleaning gas is allowed to flow through the buffer chamber 237 and the second nozzle 249b so that excessive deterioration of the buffer chamber 237 and second nozzle 249b can be inhibited. As a result, since a pressure in the process chamber 201 may also be further increased, degradation of the $NF_3$ gas may be facilitated, and the $NF_3$ gas may be removed by reaction with a deposit or a cumulative film. Also, consumption efficiency of the $NF_3$ gas may be improved.

Step 307, Fourth Process (for Example, 10 Seconds)

In Step 307, the APC valve 244 is opened to initiate exhaust treatment of the inside of the process chamber 201 so that the $NF_3$ gas remaining in the process chamber 201 and a reaction generating gas of the cumulative film are exhausted.

The inside of the process chamber 201 is self-cleaned by performing a cycle, which includes Steps 304 to S307 as described above, at least once (Step 308). Also, the above-described cycle may be repeatedly performed a number of times.

When the above-described cleaning treatment is performed, the inert gas such as $N_2$ gas is supplied into the process chamber 201 and then exhausted so that an inside of the process chamber 201 is purged with the inert gas (gas purging, Step 309). Thereafter, an atmosphere in the process chamber 201 is replaced with the inert gas (inert gas replacement) so that a pressure in the process chamber 201 returns to normal pressure (returning to atmospheric pressure, Step 310).

Next, the seal cap 219 is lowered by means of the boat elevator 115, and a lower end of the manifold 209 is opened to unload the empty boat 217 from the lower end of the manifold 209 out of the reaction tube 203 (boat unloading, Step 311).

According to the cleaning process according to this embodiment, an amount of a deposit or a cumulative film that may be removed during one cycle of treatments (including first to fourth processes) depends mainly on a supply amount of the cleaning gas supplied during the above-described second process and a temperature in the process chamber.

By repeatedly performing the above-described cycle, the SiN film and the $NF_3$ gas also react in a gas retention area (dead space) in which the flow of a gas in the process chamber 201 slows down so that a deposit or a cumulative film can be removed by a chemical reaction in which silicon tetrafluoride ($SiF_4$) gas or nitrogen ($N_2$) gas is formed. Also, consumption efficiency of the cleaning gas that is relatively more expensive than the inert gas such as nitrogen gas may be improved.

Figure 7:
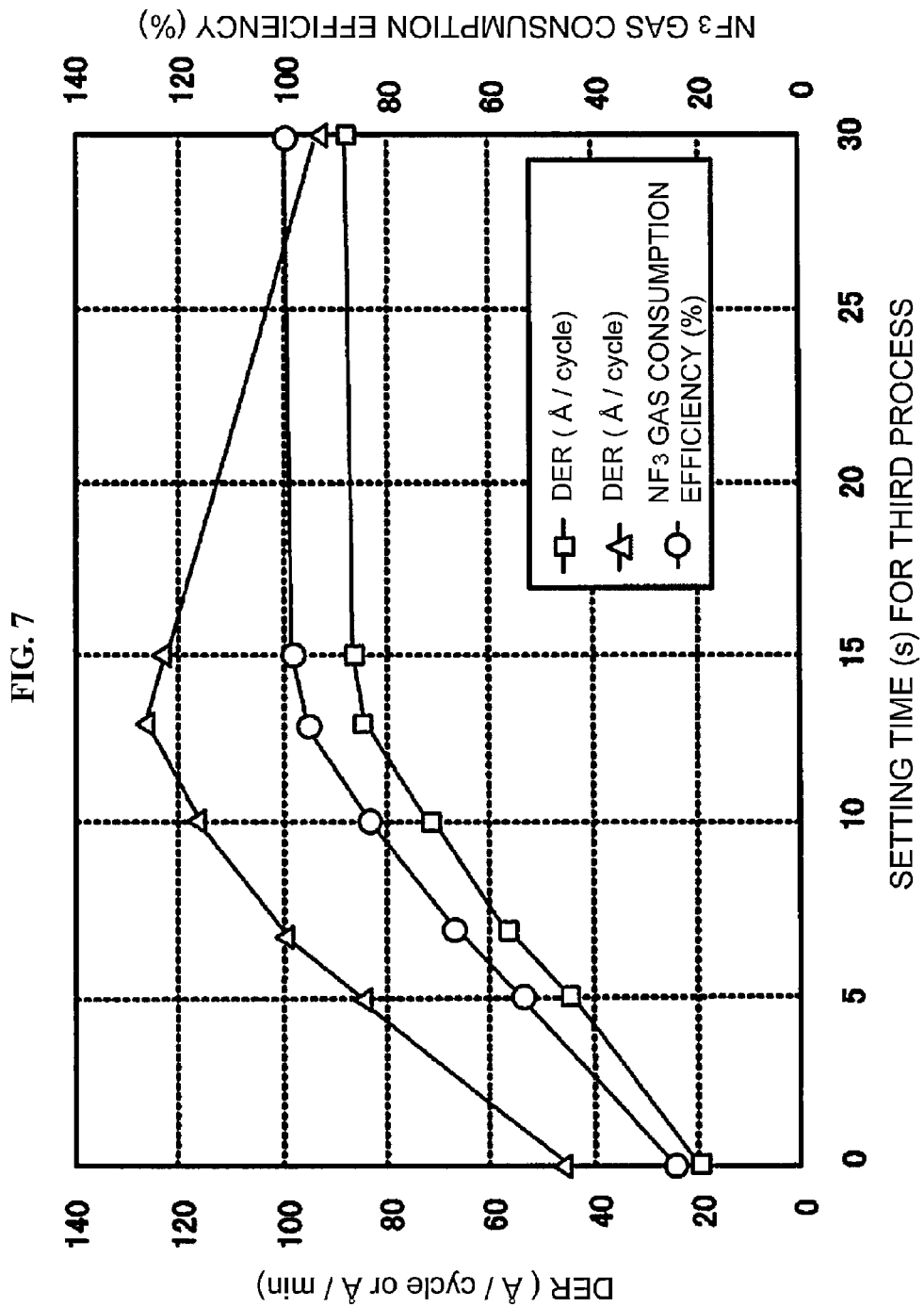
FIG. 7 is a diagram showing FIG. 6 in the form of a graph.

FIG. 6 shows the experimental results showing a relationship between a setting time of the above-described third process and a reduction amount of a SiN film per cycle in the cleaning process which may be preferably used in one embodiment of the present invention. FIG. 7 is a diagram showing FIG. 6 in the form of a graph. Here, a reduction amount of the SiN film is expressed as a dry etching rate (DER), a DER (Å/cycle) represents a reduction amount (Å: angstroms) of a SiN film per cycle, and a DER (Å/min) represents a substantial cleaning speed per minute.

As described above, the $NF_3$ gas is also used as the cleaning gas, and a temperature in the process chamber 201 is set to a temperature of 625° C.

Here, the consumption efficiency of the cleaning gas is defined as follows: (Amount of unreacted cleaning gas exhausted in fourth process)/(Amount of cleaning gas introduced in second process). Also, the consumption efficiency of the cleaning gas may be examined by examining dependency of a reduction amount of a cumulative film (a SiN film) per cycle on a time of the third process without analyzing the exhaust gas in the fourth process.

As shown in FIGS. 6 and 7, by observing the DER (Å/min), it could be seen that an optimum setting time of the third process is 13 seconds. Also, it could be seen that the DER (Å/cycle) is not significantly increased at 13 seconds or more. Thus, an upper limit of the DER (Å/cycle) is mainly determined according to an amount of the cleaning gas, $NF_3$ gas, introduced in the second process. Also, a reason that the DER (Å/cycle) does not increase even when a time in the third process is set to 13 seconds or more is considered to be due to the fact that most of the $NF_3$ gas introduced in the second process reacts with a cumulative film present in the process chamber 201 so that most of the $NF_3$ gas in the process chamber 201 disappears within 13 seconds or more. Therefore, it could be seen that the self cleaning in which there is a limit in one cycle may be performed using a supply amount of the $NF_3$ gas in the second process and a setting time in the third process. That is, consumption efficiency of the cleaning gas ($NF_3$ gas) may be improved by adjustment of the third process. For example, when the $NF_3$ gas flows at a flow rate of 2 slm for 15 seconds in the second process, a total supply amount of the $NF_3$ gas into the process chamber 201 is 500 cc. A maximum etching amount of the etched deposit or cumulative film may be prescribed according to an amount of the $NF_3$ gas supplied in the second process. In this case, when there is no third process, the $NF_3$ gas is substantially exhausted via the exhaust pipe 231. Thus, the etching amount may not be easily prescribed since the deposit or cumulative film should be etched at an amount less than the maximum etching amount. However, since the third process is performed in this embodiment, the etching amount is easily prescribed.

Also, when there is the third process, a given amount of the cleaning gas may convectively flow in the process chamber 201. As a result, the cleaning gas may optionally react with the deposit or cumulative film, and deterioration and damage of members constituting the process chamber 201 caused by reaction of the members with the cleaning gas may be reduced. For example, the $NF_3$ gas may optionally react with the deposit or cumulative film such as a SiN film, and deterioration and damage of the quartz members, for example, the reaction tube 203, the first nozzle 249a and the second nozzle 249b, which are the members constituting the process chamber 201, caused by reaction of the quartz member with the $NF_3$ gas may be reduced.

In addition, since the third process is performed, a problem by which the unreacted $NF_3$ gas in the process chamber 201 causes damage to the exhaust system such as the exhaust pipe 231 may be inhibited.

When there is no third process, the consumption efficiency of the $NF_3$ gas supplied into the process chamber 201 in the second process may be 23%. On the other hand, when the third process is performed, the consumption efficiency of the $NF_3$ gas supplied into the process chamber 201 in the second process may be 97%, and thus the consumption efficiency of the cleaning gas may be remarkably improved.

Also, changes in various conditions, such as an increase in temperature in the process chamber 201, an increase in a supply amount of the $NF_3$ gas in the second process, a change in capacity in the process chamber 201, a change in a flow rate of $N_2$ gas serving as the inert gas, and a change in length of a supply pipe of $NF_3$ gas, is presumed to exert influence on an optimal value of the setting time of the third process. Therefore, when the cleaning process according to one embodiment of the present invention is performed, the conditions as described above may be examined to perform an optimized process.

As described above, according to the cleaning process according to this embodiment, the conditions may be readily optimized while identifying an amount of the consumed cleaning gas, and damage of components of the process chamber (time-dependent change) may be lowered. That is, an upper limit value of DER (Å/cycle) may be prescribed according to a supply amount of the cleaning gas in one cycle of the second process, and a limit of an amount of a deposit or cumulative film etched by a supply amount of the cleaning gas per cycle (cumulative film reduction amount) may be determined. Since the cleaning in which there is a limit per cycle may be performed, damage of the members constituting the process chamber 201 by the self cleaning (time-dependent change) may be inhibited compared with the related art, and an exchange period of the members constituting the process chamber 201 may be lengthened, and thus an apparatus may be stably driven for a long period of time.

Figure 8A:
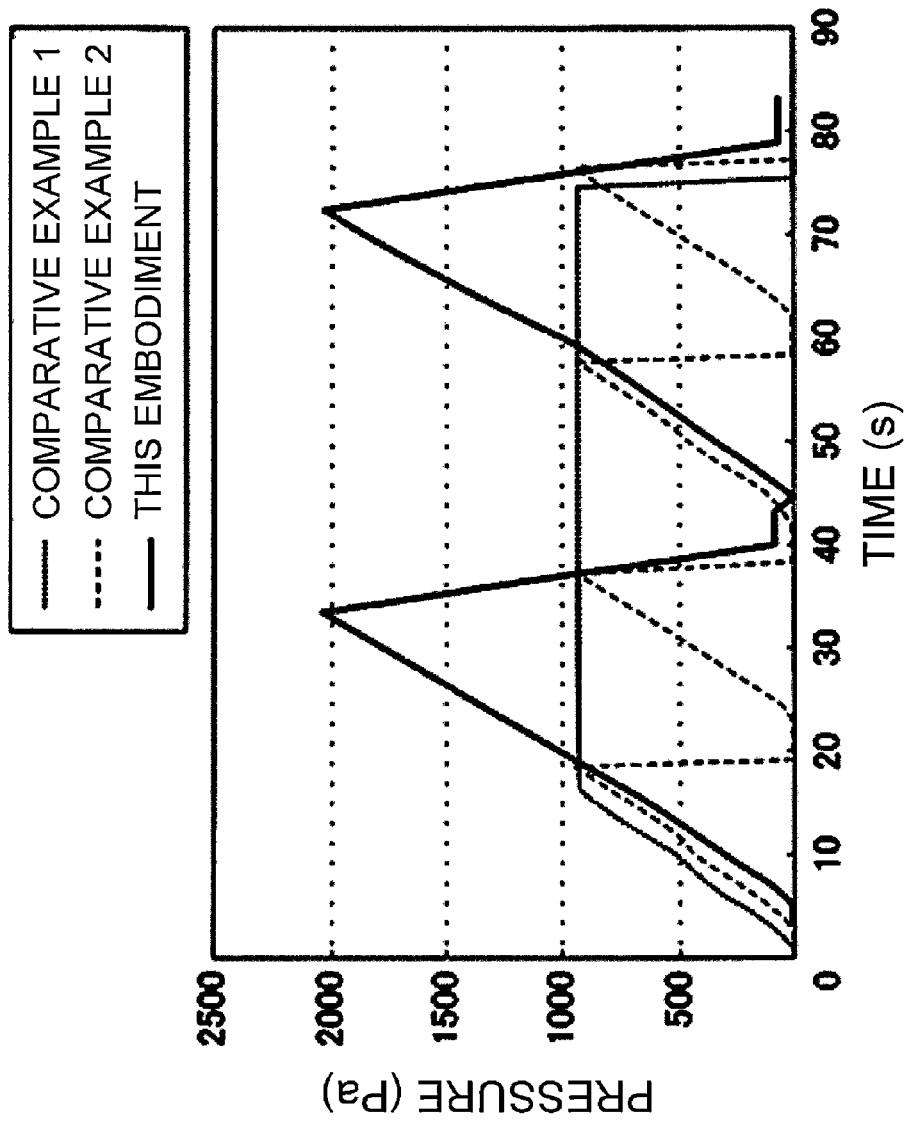
FIG. 8A is a diagram for explaining a relationship between pressure and time of the cleaning process according to this embodiment and Comparative Example.
Figure 8B:
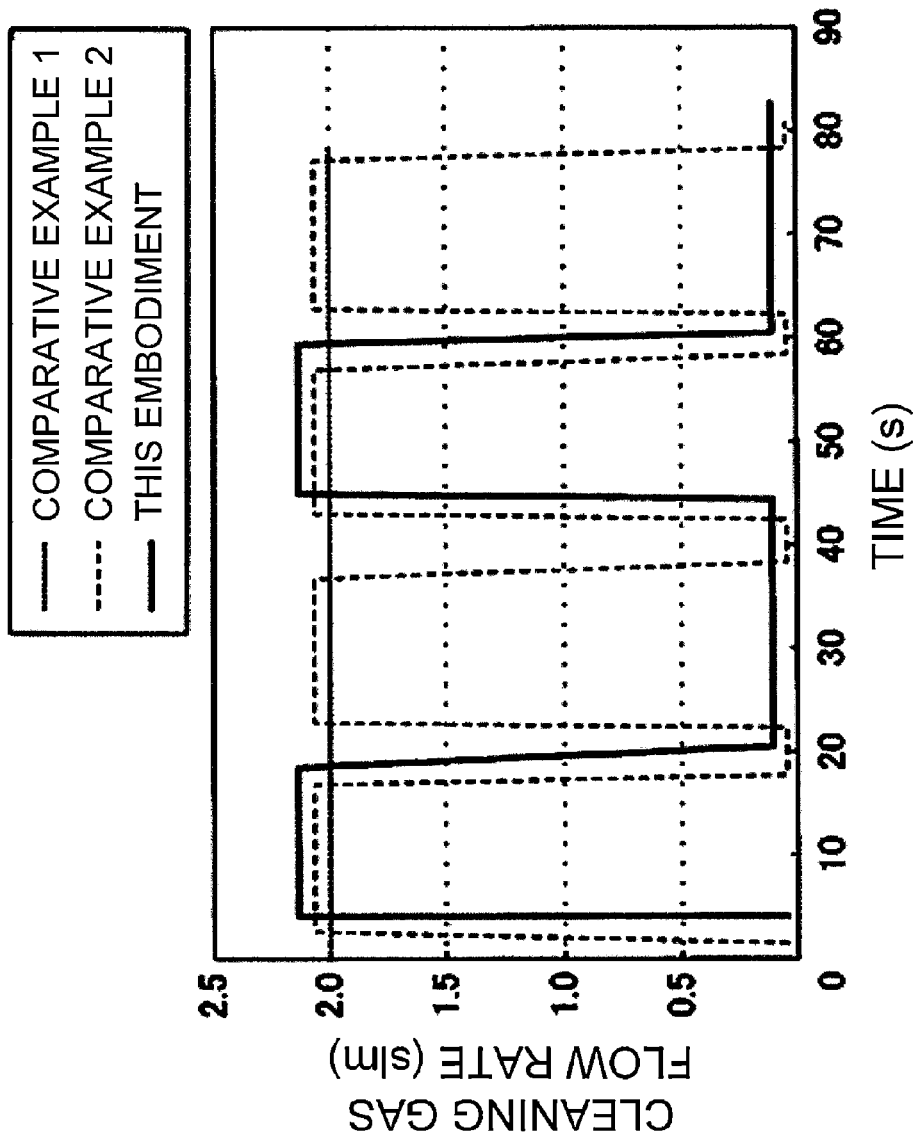
FIG. 8B is a diagram for explaining a relationship between a cleaning gas flow rate and time of the cleaning process according to this embodiment and Comparative Example.

FIG. 8 is a diagram for explaining a cleaning process according to this embodiment and Comparative Example, and FIG. 9 is an image diagram showing a state of an inside of the reaction tube 203 when the cleaning process according to this embodiment and Comparative Examples is used.

Figure 9A:
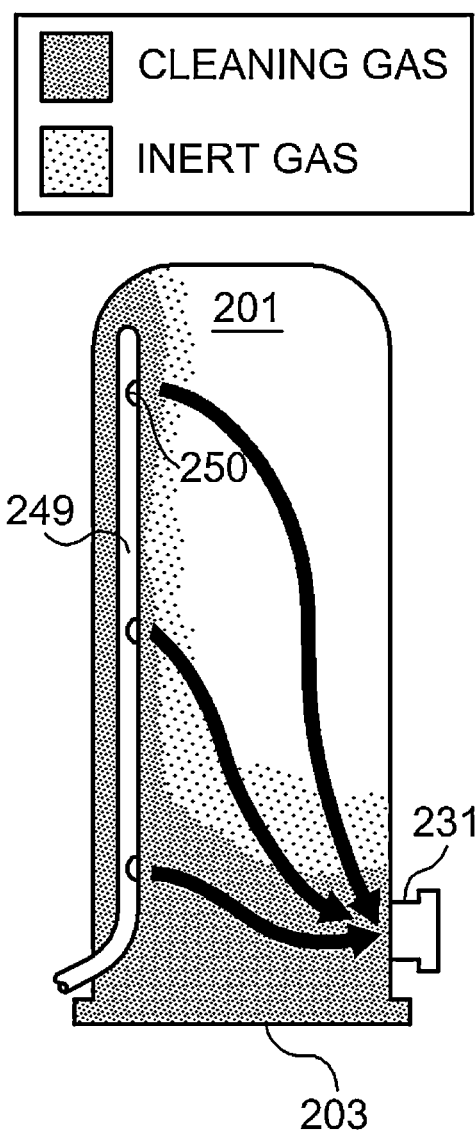
FIG. 9A is a diagram showing a state in a reaction tube when an exhaust pipe is arranged at a lower portion of the reaction tube in the cleaning process according to Comparative Example.
Figure 9B:
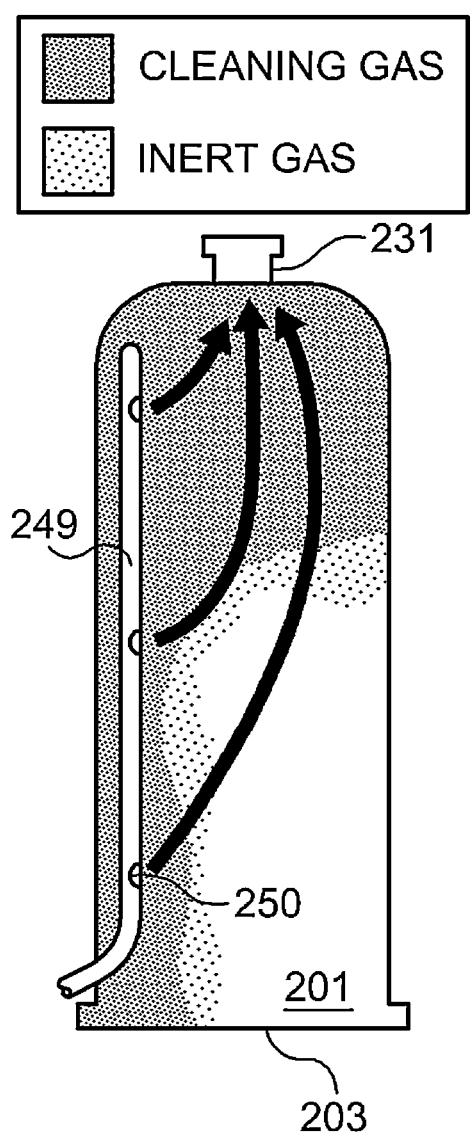
FIG. 9B is a diagram showing a state in the reaction tube when the exhaust pipe is arranged at an upper portion of the reaction tube in the cleaning process according to Comparative Example.

Comparative Example 1 is an example in which the cleaning is performed by supplying a constant supply amount of the cleaning gas while constantly maintaining a pressure in the process chamber 201 by adjusting an opening degree of the APC valve 244, and an example in which the first process is not performed (i.e., the exhaust treatment is not suspended) in the cleaning process according to this embodiment. When the exhaust pipe 231 is arranged at a lower portion of the reaction tube 203 as shown in FIG. 9A, and the exhaust pipe 231 is arranged at an upper portion of the reaction tube 203 as shown in FIG. 9B, it can be seen that the cleaning gas concentrates on a periphery of the nozzle 249 in the reaction tube 203 and a periphery of the exhaust pipe 231 (an exhaust port) so that an atmosphere of the process chamber 201 is not uniformly formed.

Figure 9C:
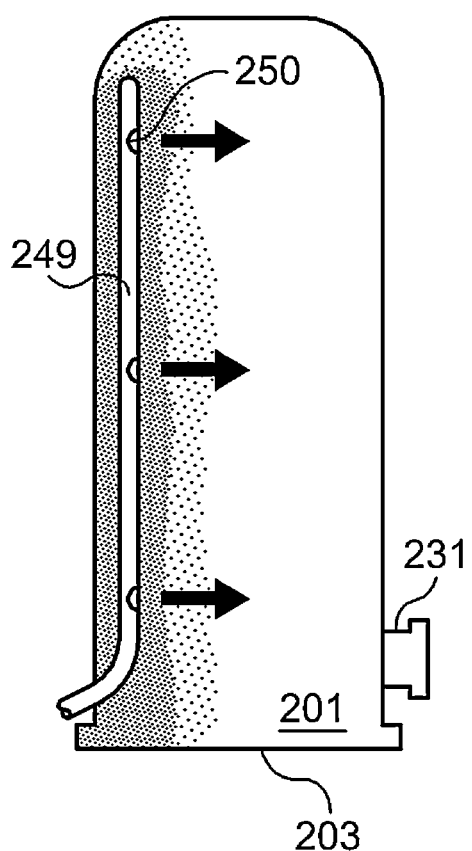
FIG. 9C is a diagram showing a state in the reaction tube when a third process is not performed in the cleaning process according to Comparative Example.

Comparative Example 2 is an example in which the third process (inert gas supply) is not performed in the cleaning process according to this embodiment as described above. As shown in FIG. 9C, it can be seen that the cleaning gas stays in a periphery of the nozzle 249 in the reaction tube 203 and a dead space between the nozzle 249 and the reaction tube 203 so that an atmosphere of the process chamber 201 is not uniformly formed. In this case, the unreacted cleaning gas also stays in the nozzle 249 or a gas supply pipe (not shown), and the cleaning gas in an unreacted state is exhausted during the exhaust treatment. As a result, the consumption efficiency of the cleaning gas is lowered (the cleaning gas is wasted).

Figure 9D:
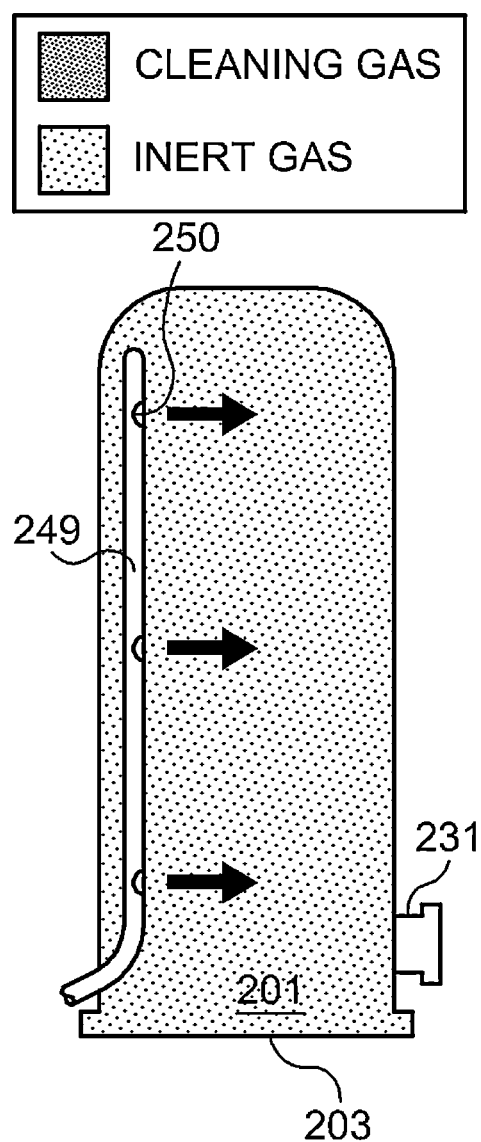
FIG. 9D is a diagram showing a state in the reaction tube when the cleaning process according to this embodiment is used.

Meanwhile, according to the cleaning process according to this embodiment, a pressure in the process chamber 201 is increased by supplying the inert gas for a given period of time while suspending the exhaust treatment as shown in FIG. 9D, and the atmosphere in the process chamber 201 is uniformly formed. Also, since the gas in the nozzle 249 is pushed out into the process chamber by the inert gas, the consumption efficiency of the cleaning gas may be improved compared with the related art.

That is, according to the embodiments of the present invention, the self cleaning which does not depend on the gas flow or structure of hardware may be realized, and the consumption efficiency of the cleaning gas may be improved while reducing damage of components of the hardware. As a result, the productivity may be improved.

As described above, according to the embodiments of the present invention, at least one of the following effects may be achieved:

(1) Contamination of an inside of the reaction tube by foreign substances may be inhibited.

(2) Consumption efficiency of the cleaning gas may be improved.

(3) An optimal cleaning speed may be determined.

(4) An inflow of the excessive cleaning gas into the quartz members and the exhaust system may be inhibited, and a time-dependent change of quartz members and the exhaust system may be inhibited.

(5) Isotropic cleaning which does not depend on a dead space caused depending on the structure of the reaction chamber can be performed.

(6) A phenomenon in which a residue after the cleaning is reduced to accelerate a drop in film thickness by inhibiting a time-dependent change of the exhaust system may be inhibited.

(7) An apparatus may be stably driven for a long period of time by inhibiting the time-dependent change, thereby saving the costs of operation of the apparatus.

(8) In the conventional cleaning treatment, a film residue is generated in an area in which the flow of a gas in the process chamber 201 slows down, such as a region between the reaction tube 203 and the nozzle 249 configured to supply a cleaning gas, as shown in FIG. 10. Then, when the film formation treatment and cleaning treatment are continuously performed, particles may be gradually formed by deposition of a film residue (foreign substances). According to this embodiment, the cause of these problems may be inhibited. That is, since the cleaning gas may be readily spread to the dead space in the process chamber 201, a film remaining in an area in which the flow of a gas in the process chamber 201 slows down can be removed, and generation of the particles may be inhibited.

(9) In the conventional cleaning treatment, efficiency is low since a portion of the cleaning gas supplied into the process chamber 201 in an unreacted state is exhausted through the exhaust pipe. To solve these problems, a cleaning time is lengthened (increase in over-etching amount), the reaction tube is frequently exchanged, or maintenance tasks such as wet washing treatment are performed. As a result, however, an increase in cost for operation of an apparatus (an increase in exchange frequency of heat-resistant members such as a reaction tube, and an increase in consumption of the cleaning gas) results in a decrease in productivity. According to this embodiment, the cause of these problems may be inhibited.

That is, since exhausting the cleaning gas in an unreacted state through the exhaust pipe from the process chamber 201 may be inhibited, the consumption efficiency may be improved. Also, since a cleaning time may be shortened, and an increase in damage caused by an increase in over-etching amount in an area in which a deposit (a deposition film or a cumulative film) is not easily formed in the process chamber 201 may be inhibited, an exchange frequency of the members constituting of the process chamber 201, for example, a reaction tube, may be reduced. Also, maintenance tasks such as boat wet washing treatment may be inhibited, and thus costs of operation of an apparatus may be reduced. As a result, the productivity may be improved.

(10) In the conventional cleaning treatment, opening diameters of the gas supply holes of the nozzle, component parts of the boat serving as a substrate retainer configured to retain a substrate, or components of the reaction chamber (a process chamber) such as a reaction tube may be apt to cause a time-dependent change. Here, since a fresh cleaning gas flows through the gas supply holes of the nozzle, the opening diameters of the gas supply holes may increase with a frequency of the cleaning treatment. Since the gas supplied into the nozzle stays in the nozzle and then is discharged to the reaction chamber through the gas supply holes, a pressure in the nozzle is higher than that of the reaction chamber. Therefore, since an inside of the nozzle or the gas supply holes is easily etched by the cleaning gas, the nozzle or the gas supply holes may be easily deteriorated. In particular, when a material such as quartz is, for example, used as a material of the nozzle, a selection ratio may not be easily obtained due to a difference in quartz and a material of the deposit in the nozzle, which is caused when a film such as SiN is formed on a substrate in the reaction chamber. According to this embodiment, the cause of these problems may be inhibited. That is, a time-dependent change of component parts of the reaction chamber (a process chamber) may be inhibited. In particular, since the cleaning gas is broadly spread over the process chamber 201, the cleaning gas may selectively react with a deposit unevenly formed in the process chamber 201 (the cleaning gas may selectively react with the deposit by allowing the cleaning gas to stay in the process chamber 201 even when some of the members constituting the reaction chamber, for example, quartz, are exposed to the cleaning gas during the cleaning treatment), and a level of deterioration of the boat or the reaction tube may be uniformly realized.

Also, an increase in the opening diameters of the gas supply holes of the nozzle may be inhibited. In particular, although the selection ratio is not easily obtained due to a difference in quartz and a material of the deposit in the nozzle, which is caused when a film such as SiN is formed on a substrate in the reaction chamber, when a material such as quartz is used as the material of the nozzle, deterioration of the nozzle or the gas supply holes may be inhibited.

(11) In particular, in a vertical patch-type processing apparatus, nozzles having a plurality of gas supply holes arranged in an extending direction of the nozzles may be used here. In this case, since a time-dependent change of the opening diameters of the gas supply holes present in an area through which a fresh cleaning gas flows, which is an upstream side of the nozzle and which is adjacent to an introduction port for a cleaning gas, is higher than that of the opening diameters of the gas supply holes adjacent to a downstream side of the nozzle, an in-plane uniformity in film formation is changed with time as an apparatus is driven. According to this embodiment, the cause of these problems may be inhibited. That is, when the nozzle having a plurality of gas supply holes formed therein is used, a time-dependent change of the opening diameters of the gas supply holes present in an area through which a fresh cleaning gas flows, which is an upstream side of the nozzle and which is adjacent to an introduction port for a cleaning gas may be inhibited from being increased more than that of the opening diameters of the gas supply holes. As a result, an in-plane uniformity in film formation is changed with time as an apparatus is driven.

(12) In the conventional cleaning treatment, an exhaust port configured to exhaust a gas in the reaction tube has a high time-dependent change since the exhaust port is arranged in a region in which the cleaning gas excited by heat in the reaction tube gathers. Therefore, strength is degraded as an apparatus is driven, and a heat-resistant member such as a reaction tube or a boat is broken. As a result, the cost of operation of the apparatus is increased due to complicated structure of the apparatus. Also, since some of the cleaning gas supplied into the process chamber 201 in an unreacted state is exhausted through the exhaust pipe, the efficiency of the cleaning gas is degraded. Also, as the unreacted cleaning gas is allowed to flow into the exhaust systems such as an exhaust pipe, an APC valve, a vacuum device, and a abatement equipment through the exhaust port, these exhaust systems may be corroded. According to this embodiment, the cause of these problems may be inhibited. That is, the consumption efficiency of the cleaning gas may be improved by facilitating reacting the cleaning gas with the deposit in the reaction chamber (a reaction tube, referred to as a process chamber), and thus the cleaning gas excited with heat as described in the related art may be inhibited from reacting with a peripheral region of the exhaust port since the gas after the reaction gathers mainly on the exhaust port. Also, the unreacted cleaning gas may be inhibited from flowing out from the exhaust system, and thus corrosion of the exhaust system may be inhibited from taking place.

(13) According to the third process, a high change in pressure in the process chamber 201 may be reduced by exhausting an inside of the process chamber 201 in the fourth process in a state in which a pressure in the process chamber 201 is enhanced. Particles generated in the process chamber 201 or fragments peeled from films by the cleaning treatment may be allowed to move to a downstream side (at least a downstream side of the exhaust pipe 231 from the exhaust port between the process chamber 201 and the exhaust pipe 231) due to such a change in pressure. Preferably, since the particles or the fragments move to a downstream side from the APC valve 244, particles generated in the subsequent film formation process or fragments peeled from films may be inhibited from exerting a bad influence. In the fourth process, since the inside of the process chamber 201 is exhausted for a short period of time, a higher change in pressure in the process chamber 201 is preferably made.

Second Embodiment of the Present Invention

Next, a second embodiment of the present invention will be described.

In the above-described first embodiment, first the APC valve 244 is closed to suspend exhaust treatment of the inside of the process chamber 201 in Step 304 (first process) of the cleaning process. In this embodiment, however, the APC valve 244 is not completely closed to limit an exhaust amount in the process chamber 201.

Also, the above-described first embodiment and this embodiment have a common point in that the deposit in the process chamber 201 is removed by reaction with the cleaning gas by supplying the inert gas to increase a pressure in the process chamber in a state in which the cleaning gas stays in the process chamber 201.

Points other than this common point are substantially the same as those of the first embodiment, the description is omitted, and the cleaning process will thus be described in detail.

Cleaning Process

Step 404, First Process (for Example, 1 Second)

First, the APC valve 244 is controlled so that an opening degree of the APC valve 244 decreases, thereby reducing an exhaust amount in the process chamber 201. Preferably, a supply amount of a gas supplied into the process chamber 201 is adjusted to be lower than the exhaust amount in Step 405 as will be described below.

Step 405, Second Process (for Example, 15 Seconds)

In Step 405, a predetermined amount (for example, 1,000 cc) of the $NF_3$ gas is allowed to flow into the process chamber 201 in state in which the exhaust amount is limited. That is, the $NF_3$ gas is allowed to flow into the cleaning gas supply pipe 252a by opening/closing the valves 254a and 256a of the cleaning gas supply pipe 252a. A flow rate of the $NF_3$ gas flowing through the cleaning gas supply pipe 252a is adjusted by means of the mass flow controller 253a. The $NF_3$ gas whose flow rate is adjusted is supplied into the process chamber 201 through the gas supply holes 250a of the first nozzle 249a. In this case, 75 cc of the $N_2$ gas that is the inert gas is, for example, supplied into the process chamber 201 through the inert gas supply pipe 232c. During the above-described operation, a temperature in the process chamber 201 is also maintained at 630° C.

In the second process, since the exhaust amount is limited in the above-described first process, the cleaning gas ($NF_3$ gas) is uniformly spread without depending on the structure of the reaction chamber. This is because an isotropic increase in pressure in the process chamber 201 takes place by limiting the exhaust treatment since the gas has a nature in which a pressure flows from a high pressure zone to a low pressure zone. For example, a pressure in the process chamber 201 may be maintained at 500 Pa to 1,000 Pa.

Step 406, Third Process (X Seconds)

In Step 406, the valves 254a and 256a are closed to suspend the supply of the $NF_3$ gas, and a predetermined amount (for example, 5 slm) of the $N_2$ gas serving as the inert gas is allowed to flow by opening/closing the valve 243c and valves 247a and 251a of the inert gas supply pipe 232c. That is, rather than the $NF_3$ gas serving as the cleaning gas, the inert gas that does not etch the reaction tube 203, the buffer chamber 237, the first nozzle 249a, and the second nozzle 249b, which are the members constituting the process chamber 201, is supplied into the process chamber 201 so as to increase pressure in the process chamber 201.

Therefore, a pressure in the process chamber 201 may be enhanced, decomposition of the $NF_3$ gas may be facilitated due to an increase in pressure, and the $NF_3$ gas may be removed by reaction with a deposit or a cumulative film. Also, the consumption efficiency of the $NF_3$ gas may be improved.

In the third process, the $NF_3$ gas remaining in the first nozzle 249a is also pushed out by the $N_2$ gas by supplying the $N_2$ gas through the first nozzle 249a. As a result, an equivalent amount of the $NF_3$ gas may be supplied from an upstream side (lower portion) of the first nozzle 249a through each of the gas supply holes 250a that are arranged at a downstream side (upper portion) of the first nozzle 249a, and a time-dependent change in an opening area of each of the gas supply holes 250a may be made uniform. That is, when there is no third process, the opening areas of the gas supply holes 250a that are arranged at the upstream side of the first nozzle 249a should be further increased since a larger amount of the $NF_3$ gas is allowed to flow through the gas supply holes 250a that are arranged at the upstream side of the first nozzle 249a. As a result, in the subsequent film formation process, a larger amount of the source gas is allowed to flow in the wafers 200 that are arranged at the upstream side than the downstream side of the first nozzle 249a. Therefore, since there is a difference in film thickness between the downstream side and the upstream side, the uniformity in film thickness between the wafers 200 is degraded. However, these problems may be solved by performing the third process. For example, a pressure in the process chamber 201 may be maintained at 1,500 Pa to 2,000 Pa.

Step 407, Fourth Process (for Example, 10 Seconds)

In Step 407, an opening degree of the APC valve 244 is widened to initiate exhaust treatment of the inside of the process chamber 201, and the $NF_3$ gas remaining in the process chamber 201 and a reaction generating gas of the cumulative film are exhausted.

The inside of the process chamber 201 is self-cleaned by performing one cycle, which includes Steps 404 to S407 as described above, at least once (Step 408). Also, the above-described cycle may be repeatedly performed a number of times.

According to this embodiment, since the cleaning gas that does not react in the process chamber 201 flows in an unreacted state in the exhaust system, the cleaning gas may have increased probability of causing damage to members constituting the exhaust system by reaction with the members, but the same effects as at least one of the effects described in the first embodiment may be achieved.

Third Embodiment of the Present Invention

Next, a third embodiment of the present invention will be described.

In the first embodiment as described above, the supply of the cleaning gas is suspended and a predetermined amount of the inert gas is allowed to flow instead of the cleaning gas in Step 306 (third process) of the cleaning process. In this embodiment, however, the supply of the cleaning gas is suspended, and a predetermined amount of another cleaning gas, which has a lower etchability against the members constituting the process chamber 201 than the suspended cleaning gas, is allowed to flow. When a predetermined amount of the other cleaning gas, which has a lower etchability against the members constituting the process chamber 201 than the suspended cleaning gas, is allowed to flow as described above, damage to the corresponding component parts may be inhibited.

Also, the above-described first embodiment and this embodiment have a common point in that the deposit in the process chamber 201 is removed by reaction with the cleaning gas by supplying the inert gas to increase a pressure in the process chamber in a state in which the cleaning gas stays in the process chamber 201.

Points other than this common point are substantially the same as those of the first embodiment, the description is omitted, and the cleaning process will thus be described in detail. Also, since the valve 243c and valves 247a and 251a of the inert gas supply pipe 232c serving as the inert gas supply system shown in FIG. 1 as described in the above-described first embodiment have the same configuration as the valves 243c and 247a and 251a of the second gas supply pipe 232c serving as the second gas supply system configured to supply a second gas as will be described below, the former is replaced with the latter and then described for the sake of convenience of description.

Cleaning Process

Step 504: First Process (for Example, 1 Second)

First, the APC valve 244 is closed to suspend exhaust treatment on an inside of the process chamber 201.

Step 505, Second Process (for Example, 15 Seconds)

In Step 505, a predetermined amount (for example, 500 cc) of the $NF_3$ gas is allowed to flow into the process chamber 201 in which the exhaust treatment is suspended. That is, the $NF_3$ gas is allowed to flow into the cleaning gas supply pipe 252a by opening/closing the valves 254a and 256a of the cleaning gas supply pipe 252a. A flow rate of the $NF_3$ gas flowing through the cleaning gas supply pipe 252a is adjusted by means of the mass flow controller 253a. The $NF_3$ gas whose flow rate is adjusted is supplied into the process chamber 201 through the gas supply holes 250a of the first nozzle 249a. In this case, 75 cc of the $N_2$ gas that is the inert gas is, for example, supplied into the process chamber 201 through the inert gas supply pipe 232c. During the above-described operation, a temperature in the process chamber 201 is also maintained at 630° C.

In the second process, since the exhaust treatment is suspended in the above-described first process, the cleaning gas ($NF_3$ gas) is uniformly spread without depending on the structure of the reaction chamber. This is because an isotropic increase in pressure in the process chamber 201 takes place by suspending the exhaust treatment since the gas has a nature in which a pressure flows from a high pressure zone to a low pressure zone. For example, a pressure in the process chamber 201 may be maintained at 500 Pa to 1,000 Pa.

Step 506, Third Process (X Seconds)

In Step 506, the valves 254a and 256a are closed to suspend the supply of the $NF_3$ gas, and a predetermined amount (for example, 1 slm) of tetrafluoromethane ($CF_4$) gas serving as the second gas may be allowed to flow by opening/closing the valve 243c and valves 247a and 251a of the inert gas supply pipe 232c. That is, another gas, which has a lower etchability against the members (that is, the reaction tube 203, the buffer chamber 237, the first nozzle 249a, and the second nozzle 249b) constituting the process chamber 201 than the $NF_3$ gas serving as the first cleaning gas, is supplied into the process chamber 201 so as to increase a pressure in the process chamber 201. Therefore, a pressure in the process chamber 201 may be enhanced, decomposition of the $NF_3$ gas may be facilitated due to an increase in pressure, and the $NF_3$ gas may be removed by reaction with a deposit or a cumulative film. Also, the consumption efficiency of the $NF_3$ gas may be improved.

In the third process, the $NF_3$ gas remaining in the first nozzle 249a is also pushed out by the $N_2$ gas by supplying the $N_2$ gas through the first nozzle 249a. As a result, an equivalent amount of the $NF_3$ gas may be supplied from an upstream side (lower portion) of the first nozzle 249a through each of the gas supply holes 250a that are arranged at a downstream side (upper portion) of the first nozzle 249a, and a time-dependent change in an opening area of each of the gas supply holes 250a may be made uniform. That is, when there is no third process, the opening areas of the gas supply holes 250a that are arranged at the upstream side of the first nozzle 249a should be further increased since a larger amount of the $NF_3$ gas is allowed to flow through the gas supply holes 250a that are arranged at the upstream side of the first nozzle 249a. As a result, in the subsequent film formation process, a larger amount of the source gas is allowed to flow in the wafers 200 that are arranged at the upstream side than the downstream side of the first nozzle 249a. Therefore, since there is a difference in film thickness between the downstream side and the upstream side, the uniformity in film thickness between the wafers 200 is degraded. However, these problems may be solved by performing the third process.

Also, the deposit or the cumulative film that may not be etched by the first cleaning gas may be etched by the second cleaning gas (that is, a second gas), and deterioration of the members constituting the process chamber 201 by etching can be inhibited.

Preferably, a gas that does not explode when reacting with the first cleaning gas used in the second process is used as the second gas. In addition to the gas, a fluorocarbon gas, that is, a material represented by $C_xF_y$ (x≥1, y≥4) may be, for example, used herein.

Step 507, Fourth Process (for Example, 10 Seconds)

In Step 507, the APC valve 244 is opened to initiate exhaust treatment of the inside of the process chamber 201 so that the $NF_3$ gas remaining in the process chamber 201 and a reaction generating gas of the cumulative film are exhausted.

The inside of the process chamber 201 is self-cleaned by performing one cycle, which includes Steps 504 to S507 as described above, at least once (Step 508). Also, the above-described cycle may be repeatedly performed a number of times.

According to this embodiment, the following effect may be achieved in addition to at least one of the effects described in the first embodiment. (1) When the first cleaning gas remaining in the process chamber 201 such as in the nozzles is not completely removed from the nozzles through which the first cleaning gas is supplied, deterioration of the members constituting the process chamber may be inhibited by supplying the second gas having a lower etchability against the members than the first cleaning gas. In particular, deterioration of an inner wall of the nozzle or gas supply holes provided in the nozzle may be inhibited.

Other Embodiments of the Present Invention

The other embodiments of the present invention will be described as follows. In Step 305 (second process) that is a process of supplying a cleaning gas according to the first embodiment as described above, a supply amount of the cleaning gas supplied into the process chamber may be reduced.

In this case, a cleaning time increases with a decrease in an etching rate per one cycle. For example, when a cycle including Steps 304 to S307 is performed a number of times, a desired number of cycles is eventually increased. Also, a cleaning time increases due to an increase in the valve opening/closing number or exhausting number in Steps 304 and 307. In addition, an entire consumption of the cleaning gas may not be inhibited. However, the same effects as at least one of the effects described in the first embodiment may be achieved.

Also, in Steps 304 to S307 that are the cleaning processes according to the first embodiment as described above, the APC valve 244 of Step 304 may be closed so as to delay a timing for suspending exhaust treatment of the inside of the process chamber 201, and Step 304 may be performed during Steps 305 and 306. That is, the exhaust treatment of the inside of the process chamber 201 may be suspended during supply of the cleaning gas into the process chamber 201 or in a state in which the cleaning gas stays in the process chamber 201. In this case, since the cleaning gas that does not react in the process chamber 201 flows in an unreacted state in the exhaust system, the cleaning gas has increased probability of causing damage to members constituting the exhaust system by reaction with the members, but at least one of the effects described in the first embodiment may be achieved.

Also, in Step 405 (second process) that is a process of supplying a cleaning gas according to the second embodiment, a supply amount or an exhaust amount of the cleaning gas supplied into the process chamber may be lowered. In this case, a cleaning time increases with a decrease in an etching rate per one cycle. For example, when a cycle including Steps 404 to S407 is performed a number of times, a desired number of cycles is eventually increased. Also, a cleaning time increases due to at least an increase in the exhausting number in Step 407. In addition, an entire consumption of the cleaning gas may not be inhibited. However, at least one of the effects described in the first and second embodiments may be achieved.

In the embodiments as described above, the cleaning process has been performed in a state in which the boat 217 is accommodated into the process chamber 201, but the cleaning process may be performed in a state in which the boat 217 is not present in the process chamber 201 since the boat 217 is not accommodated in the process chamber 201.

In the embodiments as described above, the reaction tube provided with an electrode and a buffer chamber is also used herein, but the present invention is applicable even when a reaction tube which does not include the electrode and the buffer chamber is used.

In the embodiments as described above, the L-shaped long nozzles are also used as the first nozzle 249a and the second nozzle 249b, but an I-shaped straight nozzle may be, for example, used instead of the L-shaped long nozzle. The gas supply hole 250a of the first nozzle 249a and the second nozzle 249b may be used in a singular number rather than a plural number. Also, the gas supply holes 250a may not open toward the center of the reaction tube 203, and may be arranged in a plural number in a space spanning from a lower portion to an upper portion of the reaction tube 203, and thus the gas supply holes 250a may not each have the same opening area or the same opening pitch.

In the embodiments as described above, the plate-shaped members 266a and 266b are also installed in the reaction tube 203, but the plate-shaped members 266a and 266b may not be installed in the reaction tube 203.

Also, the present invention applies to all of treatment methods using a vertical apparatus, such as a CVD method as well as an ALD method.

Also, in the embodiment as described above, a case in which a SiN film is formed as one example of film formation using the ALD method has been described, but the present invention is not limited thereto. For example, the present invention may also apply to amorphous silicon films, and also apply to film species and gas species without limitation.

Also, in the embodiment as described above, a case in which $NF_3$ gas is used as the first cleaning gas (etching gas) has been described, but the present invention is not limited thereto. Here, the fluorine (F)-containing gas may also be used. For example, fluorine ($F_2$) gas or chlorine fluoride ($ClF_3$) gas may be used as the fluorine-containing gas, and the cleaning gas may also be properly selected according to a deposit.

Also, a case in which the film formation is performed using a batch-type substrate processing apparatus in which a plurality of substrates are processed one by one has been described in the above-described embodiments, but the present invention is not limited thereto. The present invention may preferably apply to a case in which the film formation is performed using a single sheet-type substrate processing apparatus in which one or several substrates are processed each cycle.

Also, a combination of the above-described embodiments or modifications or applications thereof may be properly combined herein.

Also, the present invention may, for example, apply to a modified process recipe of the conventional substrate processing apparatus. When the modified process recipe is used, the process recipe according to the present invention may be installed at the conventional substrate processing apparatus via an electric communication line or a non-transitory computer readable recording medium describing the corresponding process recipe. Also, a process recipe itself can be modified into the process recipe according to the present invention by handling an input/output device of the conventional substrate processing apparatus.

Hereinafter, the present invention includes embodiments described as supplementary notes.

Supplementary Note 1

According to one embodiment of the present invention, there is provided a method of manufacturing a semiconductor device, including:

(a) forming a film on a substrate in a process chamber; and (b) removing a deposit from at least a portion of an inside of the process chamber after forming the film, wherein the step (b) includes performing a cycle a predetermined number of times, the cycle including a first process of supplying a first gas for etching the deposit into the process chamber and a second process of supplying a second gas into the process chamber so as to increase a pressure in the process chamber, the second gas being incapable of etching a member constituting the process chamber or having an etchability against the member lower than that of the first gas.

Supplementary Note 2

According to another embodiment of the present invention, there is provided a cleaning method of removing a deposit from at least a portion of an inside of a process chamber after forming a film on a substrate in the process chamber, including:

performing a cycle a predetermined number of times, the
  cycle including a first process of supplying a first gas for
  etching the deposit into the process chamber and a second
  process of supplying a second gas into the process chamber
  so as to increase a pressure in the process chamber, the
  second gas being incapable of etching a member constituting the process chamber or having an etchability against
  the member lower than that of the first gas.

Supplementary Note 3

According to still another embodiment of the present invention, there is provided a substrate processing apparatus including:

a process chamber configured to process a substrate;

an exhaust system configured to exhaust the process chamber;

a source gas supply system configured to supply into the process chamber a source gas contributing to a film formation;

a first gas supply system configured to supply a first gas capable of removing from an inside of the process chamber a deposit formed by supplying the source gas into the process chamber;

a second gas supply system configured to supply a second gas incapable of etching a member constituting the process chamber or having an etchability against the member lower than that of the first gas; and a control unit configured to control the exhaust system, the source gas supply system, the first gas supply system and the second gas supply system so as to perform a cycle a predetermined number of times, the cycle including supplying the first gas into the process chamber by the first gas supply system after supplying the source gas into the process chamber by the source gas supply system to form a film on the substrate and subsequently supplying the second gas into the process chamber by the second gas supply system so as to increase a pressure in the process chamber.

Supplementary Note 4

According to still another embodiment of the present invention, there is provided a method of manufacturing a semiconductor device, including:

(a) forming a desired film on a substrate accommodated in a process chamber by supplying a source gas to the substrate; and (b) cleaning the process chamber after unloading the substrate, wherein the step (b) includes a first process of suspending the exhaust of the process chamber, a second process of supplying a cleaning gas into the process chamber, a third process of supplying an inert gas into the process chamber, and a fourth process of exhausting the process chamber, which are sequentially performed at least once.

Supplementary Note 5

According to yet another embodiment of the present invention, there is provided a method of manufacturing a semiconductor device according to Supplementary Note 4, wherein an inside of the process chamber in the second process has a higher pressure value than the inside of the process chamber in the first process.

Supplementary Note 6

According to yet another embodiment of the present invention, there is provided a substrate processing apparatus including:

a process chamber configured to process a substrate;

an exhaust unit including an exhaust path configured to exhaust the process chamber and an exhaust valve configured to open/close the exhaust path;

a source gas supply system configured to supply a source gas, which contributes to film formation, into the process chamber;

a cleaning gas supply unit including a first supply channel configured to supply a cleaning gas, which removes a deposit attached to an inside of the process chamber by the supply of the source gas, into the process chamber, a second supply channel configured to communicate with the first supply channel to supply an inert gas into the process chamber, a first gas supply valve configured to perform opening/closing of the first supply channel and a second gas supply valve configured to perform opening/closing of the second supply channel; and a control unit, wherein the control unit is configured to control the exhaust valve, the first gas supply valve and the second gas supply valve so as to supply the cleaning gas into the process chamber through the first supply channel in a state in which the exhaust of the process chamber is suspended, supply the inert gas into the process chamber through the second supply channel in a state in which the supply of the cleaning gas is suspended after the elapse of a predetermined time and perform the exhaust of the process chamber after the elapse of a predetermined time.

Supplementary Note 7

According to yet another embodiment of the present invention, there is provided a non-transitory computer-readable recording medium storing a program causing a computer to perform a process, the process including:

(a) forming a film on a substrate in a process chamber; and (b) removing a deposit from at least a portion of an inside of the process chamber after forming the film, wherein the step (b) includes performing a cycle a predetermined number of times, the cycle including a first process of supplying a first gas for etching the deposit into the process chamber and a second process of supplying a second gas into the process chamber so as to increase a pressure in the process chamber, the second gas being incapable of etching a member constituting the process chamber or having an etchability against the member lower than that of the first gas.

What is claimed is:

1. A method of manufacturing a semiconductor device, comprising:
(a) forming a film on a substrate in a process chamber; and
(b) removing a deposit from at least a portion of an inside of the process chamber after forming the film,
wherein (b) comprises performing a cycle a predetermined number of times, the cycle comprising: (b-1) supplying a first gas for etching the deposit into the process chamber; and (b-2) supplying a second gas into the process chamber with the first gas in the process chamber so as to decompose the first gas by increasing a pressure in the process chamber, the second gas being incapable of etching a member constituting the process chamber or having an etchability against the member lower than that of the first gas.

2. The method of claim 1, wherein the second gas comprises an inert gas.

3. The method of claim 2, wherein an inert gas is further supplied in (b-1), and an amount of the second gas supplied in (b-2) is greater than an amount of the inert gas supplied in (b-1).

4. The method of claim 1, wherein (b-2) is performed with an exhaustion of the inside of the process chamber being suspended.

5. The method of claim 4, wherein (b-1) is performed with the exhaustion of the inside of the process chamber being suspended.

6. The method of claim 1, wherein:
(a) comprises supplying a reaction gas through a nozzle,
(b-1) comprises supplying the first gas through the nozzle, and
(b-2) comprises supplying the second gas through the nozzle.

7. The method of claim 1, wherein:
(a) comprises supplying an inert gas through a second nozzle while supplying a gas capable of singly forming the film through a plurality of gas supply holes provided in a first nozzle; and supplying a gas incapable of singly forming the film through the second nozzle while supplying the inert gas through the plurality of gas supply holes provided in the first nozzle,
(b-1) comprises supplying the inert gas through the second nozzle while supplying the first gas through the plurality of gas supply holes provided in the first nozzle, and
(b-2) comprises supplying the inert gas through the second nozzle while supplying the second gas through the plurality of gas supply holes provided in the first nozzle.

8. The method of claim 7, wherein each of the plurality of gas supply holes provided in the first nozzle has a same opening area.

9. The method of claim 7, wherein the plurality of gas supply holes provided in the first nozzle are disposed at a same pitch in a space spanning from an upstream side to a downstream side thereof.

10. The method of claim 1, wherein (b-2) is performed after suspending a supply of the first gas.

11. The method of claim 1, wherein the pressure in the process chamber is continuously increased by supplying the second gas into the process chamber for a predetermined period of time.

12. The method of claim 1, wherein a time period for performing (b-2) is set according to an amount of the first gas in the process chamber.

13. The method of claim 12, (b-1) is performed with a valve of an exhaust system partially closed to limit an amount of exhaustion of the process chamber.

14. The method of claim 2, wherein (b-2) is performed while maintaining the pressure in the process chamber at 1500 Pa to 2000 Pa.

15. The method of claim 1, wherein (b-2) is performed with a valve of an exhaust system partially closed to limit an amount of exhaustion of the process chamber.

16. The method of claim 15, wherein (b-1) is performed while maintaining the pressure in the process chamber at 500 Pa to 1000 Pa.

17. The method of claim 1, wherein (a) is performed in a temperature range around a temperature range of (b).

18. A cleaning method for removing a deposit from at least a portion of an inside of a process chamber after forming a film on a substrate in the process chamber, comprising:
performing a cycle a predetermined number of times, the cycle comprising: a first process of supplying a first gas for etching the deposit into the process chamber; and a second process of supplying a second gas into the process chamber with the first gas in the process chamber so as to decompose the first gas by increasing a pressure in the process chamber, the second gas being incapable of etching a member constituting the process chamber or having an etchability against the member lower than that of the first gas.

19. A non-transitory computer-readable recording medium storing a program causing a computer to perform a process, the process comprising:
(a) forming a film on a substrate in a process chamber; and
(b) removing a deposit from at least a portion of an inside of the process chamber after forming the film,
wherein (b) comprises performing a cycle a predetermined number of times, the cycle comprising: and (b-1) supplying a first gas for etching the deposit into the process chamber; and (b-2) supplying a second gas into the process chamber with the first gas in the process chamber so as to decompose the first gas by increasing a pressure in the process chamber, the second gas being incapable of etching a member constituting the process chamber or having an etchability against the member lower than that of the first gas.

* * * * *